US012777826B2

(12) United States Patent

Hyun et al.

(10) Patent No.: US 12,777,826 B2

(45) Date of Patent: Oct. 27, 2026

(54) DISPLAY APPARATUS AND ELECTRONIC DEVICE INCLUDING THE SAME

(71) Applicant: SAMSUNG DISPLAY CO., LTD., Yongin-si (KR)

(72) Inventors: Changho Hyun, Yongin-si (KR); Kyungwon Park, Yongin-si (KR); Konho Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/246,874

(22) Filed: Jun. 24, 2025

(65) Prior Publication Data

US 2026/0007059 A1 Jan. 1, 2026

(30) Foreign Application Priority Data

Jun. 26, 2024 (KR) ........................ 10-2024-0083886
Dec. 27, 2024 (KR) ........................ 10-2024-0199348

(51) Int. Cl.

| | |
|---|---|
| ***H10K 59/80*** | (2023.01) |
| ***B60K 35/22*** | (2024.01) |
| ***B60K 35/28*** | (2024.01) |
| ***G09G 3/3233*** | (2016.01) |

(Continued)

(52) U.S. Cl.

CPC ......... *H10K 59/8792* (2023.02); *B60K 35/22* (2024.01); *B60K 35/28* (2024.01); *G09G 3/3233* (2013.01); *H10K 59/353* (2023.02); *B60K 35/656* (2024.01); *B60K 2360/1523* (2024.01); *B60K 2360/167* (2024.01); *B60K 2360/349* (2024.01); *G09G 2300/0452* (2013.01); *G09G 2300/0819* (2013.01); *G09G 2300/0852* (2013.01); *G09G 2300/0861* (2013.01); *G09G 2358/00* (2013.01); *G09G 2380/10* (2013.01)

(58) Field of Classification Search

CPC ............. G09G 2310/08; G09G 3/3688; G09G 2300/0426

See application file for complete search history.

(56) References Cited

U.S. PATENT DOCUMENTS 11,435,639 B2 9/2022 Kim et al.
12,092,938 B2 9/2024 Kim et al.

(Continued)

FOREIGN PATENT DOCUMENTS

CN 115274770 A 11/2022
KR 10-2148313 B1 8/2020

(Continued)

*Primary Examiner* — Van N Chow

(74) *Attorney, Agent, or Firm* — F. CHAU & ASSOCIATES, LLC

(57) ABSTRACT

A display apparatus includes a plurality of sub-pixels arranged in rows and columns, and a plurality of light-blocking lines arranged in a first direction on one side of sub-pixels arranged in each odd column, and extending along a second direction intersecting the first direction in a plan view, wherein the sub-pixels arranged in the odd column include a plurality of unit pixels each including a first sub-pixel of a first color, a second sub-pixel of a second color, and a third sub-pixel of a third color, and in a cross-sectional view intersecting the second direction, the light-blocking lines corresponding to one of the unit pixels have a same thickness.

19 Claims, 19 Drawing Sheets

(51) Int. Cl.
*H10K 59/35* (2023.01)
*B60K 35/65* (2024.01)

(56) References Cited

U.S. PATENT DOCUMENTS

2011/0025669 A1* 2/2011 Kwak .................. G09G 3/3225 345/82
2013/0128170 A1* 5/2013 Kwon .................. G09G 3/3677 349/43
2021/0191166 A1* 6/2021 Kim .................. G02F 1/134309
2022/0206354 A1* 6/2022 Kim ...................... G02F 1/1323
2023/0200176 A1* 6/2023 Lee ........................ H10K 59/38 257/40
2025/0035975 A1* 1/2025 Miao ................. G02F 1/133514

FOREIGN PATENT DOCUMENTS

KR 10-2279480 B1 7/2021
KR 10-2022-0094411 A 7/2022

* cited by examiner

DISPLAY APPARATUS AND ELECTRONIC DEVICE INCLUDING THE SAME

CROSS-REFERENCE TO RELATED APPLICATIONS

This patent application claims priority under 35 U.S.C. § 119 to Korean Patent Application No. 10-2024-0083886, filed on Jun. 26, 2024, and Korean Patent Application No. 10-2024-0199348, filed on Dec. 27, 2024, in the Korean Intellectual Property Office, the disclosures of which are incorporated by reference in their entireties herein.

1. Technical Field

One or more embodiments are directed to a display apparatus and an electronic device including the display apparatus.

2. Discussion of Related Art

Recently, the applications of display apparatuses have become increasing diverse. As these devices continue to evolve toward thinner and lighter form factors, their usage has expanded across a wide range of fields. Alongside this trend, there is a growing demand for display apparatuses capable of delivering high-quality images. In particular, display apparatuses are now being installed within vehicles to present visual information to both the driver and passenger seats.

However, conventional display apparatuses used in vehicles often lack effective mechanisms to limit the visibility of displayed content from certain viewing angles. As a result, images intended for one occupant, such as a front-seat passenger, may be inadvertently visible to others, such as the driver, potentially causing distraction or reducing privacy. There is a need for display apparatuses capable of enhancing directional visibility control while maintaining high image quality.

SUMMARY

One or more embodiments include a display apparatus configured to block light from undesired viewing angles while enhancing display quality. The display apparatus may be incorporated into various electronic devices, including vehicles, laptops, automatic teller machine (ATM), medical equipment displays, public information Kiosks, and other portable or stationary systems where enhanced directional visibility control and user privacy are desirable.

According to one or more embodiments, a display apparatus includes a plurality of sub-pixels arranged in rows and columns, and a plurality of light-blocking lines arranged in a first direction on one side of the sub-pixels in each odd column, and extending along a second direction intersecting the first direction in a plan view, wherein the sub-pixels arranged in the odd column from among the plurality of sub-pixels include a plurality of unit pixels each including a first sub-pixel of a first color, a second sub-pixel of a second color, and a third sub-pixel of a third color, and in a cross-sectional view intersecting the second direction, the light-blocking lines corresponding to one of the unit pixels have a same thickness.

In one embodiment, in the cross-sectional view, the light-blocking lines corresponding to each of the unit pixels arranged in different columns have different thicknesses.

In one embodiment, the plurality of unit pixels may include a first unit pixel, a second unit pixel, and a third unit pixel sequentially arranged along a direction opposite to the first direction, in the cross-sectional, thicknesses of the light-blocking lines corresponding to the second unit pixel may be less than thicknesses of the light-blocking lines corresponding to the first unit pixel, and thicknesses of the light-blocking lines corresponding to the third unit pixel may be less than the thicknesses of the light-blocking lines corresponding to the second unit pixel.

In one embodiment, the plurality of unit pixels may include a first unit pixel, a second unit pixel, a third unit pixel, and a fourth unit pixel sequentially arranged along a direction opposite to the first direction, in the cross-sectional view, thicknesses of the light-blocking lines corresponding to the second unit pixel may be less than thicknesses of the light-blocking lines corresponding to the first unit pixel, thicknesses of the light-blocking lines corresponding to the fourth unit pixel may be less than thicknesses of the light-blocking lines corresponding to the third unit pixel, the thicknesses of the light-blocking lines corresponding to the third unit pixel may be same as the thicknesses of the light-blocking lines corresponding to the first unit pixel, and the thicknesses of the light-blocking lines corresponding to the fourth unit pixel may be same as the thicknesses of the light-blocking lines corresponding to the second unit pixel.

In one embodiment, each of the plurality of unit pixels may include the first sub-pixel and the second sub-pixel arranged in a first odd column, and the third sub-pixel arranged in a second odd column adjacent to the first odd column.

In one embodiment, each of the plurality of unit pixels may include the first sub-pixel arranged in a first odd column, the second sub-pixel arranged in a second odd column adjacent to the first odd column, and a third sub-pixel arranged in a third odd column adjacent to the second odd column.

In one embodiment, in a plan view, two of the light-blocking lines may be arranged corresponding to one of the unit pixels.

In one embodiment, in a plan view, three of the light-blocking lines may be arranged corresponding to one of the unit pixels.

In one embodiment, the display apparatus may further include a first driving circuit electrically connected to first gate lines configured to supply a first gate signal to the sub-pixels arranged in the odd column from among the plurality of sub-pixels, and a second driving circuit electrically connected to second gate lines configured to supply a second gate signal to the sub-pixels arranged in an even column from among the plurality of sub-pixels.

In one embodiment, the display apparatus may further include a controller, wherein, based on a control signal from the controller, the first driving circuit may be configured to supply a turn-on signal to the first gate lines and the second driving circuit may be configured to supply a turn-off signal to the second gate lines.

In one embodiment, the display apparatus may further include a substrate including a display area and a peripheral area arranged outside the display area, a display layer arranged in the display area and including a sub-pixel circuit and a light-emitting element, wherein the sub-pixel circuit and the light-emitting element are included in each of the plurality of sub-pixels, an encapsulation member covering the display layer, and a light path control layer including the plurality of light-blocking lines.

According to one or more embodiments, a vehicle is provided that includes a display apparatus disposed within a cabin of the vehicle (e.g., between its side window glasses facing each other). The display apparatus includes a plurality of sub-pixels arranged in rows and columns, and a plurality of light-blocking lines arranged in a first direction on one side of sub-pixels arranged in each odd column and extending along a second direction intersecting the first direction in a plan view. The sub-pixels arranged in the odd column include a plurality of unit pixels each including a first sub-pixel of a first color, a second sub-pixel of a second color, and a third sub-pixel of a third color. In a cross-sectional view intersecting the second direction, the light-blocking lines corresponding to one of the unit pixel have a same thickness.

In one embodiment, in the cross-sectional view, the light-blocking lines corresponding to each of unit pixels arranged in different columns may have different thicknesses.

In one embodiment, the plurality of unit pixels may include a first unit pixel, a second unit pixel, and a third unit pixel sequentially arranged along a direction opposite to the first direction, in the cross-sectional, thicknesses of the light-blocking lines corresponding to the second unit pixel may be less than thicknesses of the light-blocking lines corresponding to the first unit pixel, and thicknesses of the light-blocking lines corresponding to the third unit pixel may be less than the thicknesses of the light-blocking lines corresponding to the second unit pixel.

In one embodiment, the plurality of unit pixels may include a first unit pixel, a second unit pixel, a third unit pixel, and a fourth unit pixel sequentially arranged along a direction opposite to the first direction, in the cross-sectional view, thicknesses of the light-blocking lines corresponding to the second unit pixel may be less than thicknesses of the light-blocking lines corresponding to the first unit pixel, thicknesses of the light-blocking lines corresponding to the fourth unit pixel may be less than thicknesses of the light-blocking lines corresponding to the third unit pixel, the thicknesses of the light-blocking lines corresponding to the third unit pixel may be same as the thicknesses of the light-blocking lines corresponding to the first unit pixel, and the thicknesses of the light-blocking lines corresponding to the fourth unit pixel may be same as the thicknesses of the light-blocking lines corresponding to the second unit pixel.

In one embodiment, each of the plurality of unit pixels may include the first sub-pixel and the second sub-pixel arranged in a first odd column, and the third sub-pixel arranged in a second odd column adjacent to the first odd column.

In one embodiment, each of the plurality of unit pixels may include the first sub-pixel arranged in a first odd column, the second sub-pixel arranged in a second odd column adjacent to the first odd column, and a third sub-pixel arranged in a third odd column adjacent to the second odd column.

In one embodiment, in a plan view, two of the light-blocking lines may be arranged corresponding to one of the unit pixels.

In one embodiment, in a plan view, three of the light-blocking lines may be arranged corresponding to one of the unit pixels.

In one embodiment, the vehicle may further include a cluster, a center fascia, and a passenger seat dashboard spaced apart from the cluster with the center fascia therebetween, wherein the display apparatus may be arranged in the passenger seat dashboard.

According to one or more embodiments, an electronic device is provided that includes a display apparatus. The display apparatus includes a plurality of sub-pixels, a plurality of light-blocking lines, and a controller. The sub-pixels are arranged in rows and columns, have a plurality of unit pixels, where each unit pixel includes a first sub-pixel of a first color, a second sub-pixel of a second color, and a third sub-pixel of a third color. The light-blocking lines are disposed on one side of the sub-pixels in selected columns. The light-blocking lines extend in a direction intersecting an arrangement direction of the sub-pixels in a plan view. controller configured to operate the display apparatus in one of: a first mode in which sub-pixels in selected columns among the sub-pixels, which are adjacent to the light-blocking lines, are activated to emit light, and sub-pixels in other columns among the sub-pixels, which are not adjacent to the light-blocking lines, are deactivated; and a second mode in which the sub-pixels in other columns are activated to emit light and the sub-pixels in selected columns are deactivated.

BRIEF DESCRIPTION OF THE DRAWINGS

The above and other aspects and features of certain embodiments will be more apparent from the following description taken in conjunction with the accompanying drawings, in which.

DETAILED DESCRIPTION

Figure 1:
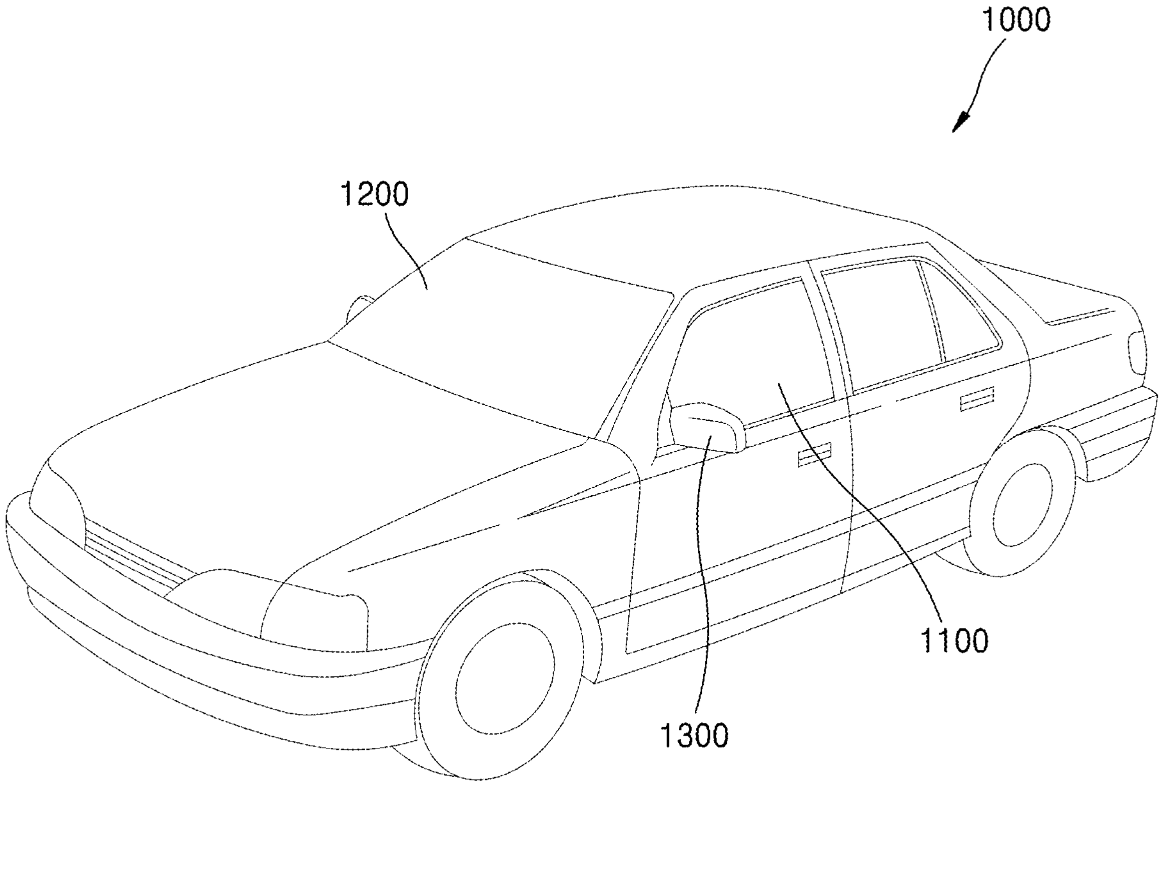
FIG. 1 is a diagram schematically showing the exterior of a vehicle, according to an embodiment.

The present disclosure is subject to various modifications and may be embodied in different forms. Specific embodiments are illustrated in the drawings and described in detail herein to facilitated understanding. However, the effects, features and principles of the disclosure are not limited to these specific embodiments, and the invention may be implemented in various ways without departing from its spirit or scope.

Hereinafter, embodiments will be described in detail with reference to the accompanying drawings, and in the following description with reference to the drawings, like reference numerals refer to like components and redundant descriptions thereof will be omitted.

In the following embodiments, the terms "first" and "second" are not used in a limited sense and are used to distinguish one component from another component.

In the following embodiments, an expression used in the singular encompasses the expression of the plural, unless it has a clearly different meaning in the context.

It will be further understood that the terms "include" and/or "comprise" used herein specify the presence of stated features or components, but do not preclude the presence or addition of one or more other features or components.

It will be understood that when a layer, region, or element is referred to as being "formed on" another layer, area, or element, it can be directly or indirectly formed on the other layer, region, or element. That is, for example, intervening layers, regions, or elements may be present.

When a certain embodiment may be implemented differently, a specific process order may be performed differently from the described order. For example, two consecutively described processes may be performed substantially at the same time or performed in an order opposite to the described order.

In the specification, "A and/or B" denotes only A, only B, or both A and B. Also, "at least one of A and B" denotes only A, only B, or both A and B.

When a layer, region, component, or the like is connected to another layer, region, component, or the like, the layer, the region, the component, or the like may be directly connected thereto and/or may be indirectly connected thereto with an intervening layer, region, component, or the like therebetween. For example, in the specification, when a layer, region, component, or the like is electrically connected to another layer, region, component, or the like, the layer, region, component, or the like may be directly electrically connected thereto and/or may be indirectly electrically connected thereto with an intervening layer, region, component, or the like therebetween.

An x-axis, a y-axis, and a z-axis are not limited to three axes on an orthogonal coordinate system, but may be interpreted in a broad sense including the three axes. For example, the x-axis, the y-axis, and the z-axis may be perpendicular to one another, or may represent different directions that are not perpendicular to one another.

At least one of the embodiments relates to a display apparatus that enhances image privacy and display quality by strategically controlling the direction of light emitted from sub-pixels. The display includes a matrix of sub-pixels arranged in rows and columns, where light-blocking lines (e.g., shading lines) are provided on one side (e.g., the left) of sub-pixels in each odd-numbered column. These lines may extend in a direction perpendicular to the column direction and serve to block light from propagating toward undesired viewing angles. This directional light control helps ensure that in privacy mode, in which only viewers within a designated range, such as a single user seated in a passenger seat or in front of a portable display (e.g., laptop, a tablet, etc.) can view the display content, thereby minimizing distractions and enhancing privacy in various environments, including vehicles and public spaces. In an embodiment, the display apparatus may be included in an electronic device having a housing that supports and encloses one or more internal components of the device. The display apparatus may be mounted to or integrated with a portion of the housing such that an image is visible to a user. The housing may correspond to an outer casing of a portable computing device, a stationary terminal, or a wall-mounted interface, and may include openings, recesses, or structural supports for securing the display apparatus.

Each unit pixel in the display may include a red, green, and blue sub-pixel, and in privacy mode, only the odd-column sub-pixels are activated, while even-column sub-pixels remain off. Because light-blocking lines are placed on the light-emitting odd columns, they effectively block light heading in a specific direction (e.g., the −x direction toward the driver). Notably, for uniformity and optical consistency, the light-blocking lines corresponding to each unit pixel in the same column may have the same thickness, though the thickness may vary between different columns to further optimize light-blocking performance depending on the viewing geometry.

In an alternative embodiment, the architecture could be reversed such that even-numbered columns are the active sub-pixel columns in the privacy mode, and the light-blocking lines are positioned on the left side (−x direction) of the even columns instead of the odd columns. To support this configuration, the controller and driving circuits would need to be adjusted so that the gate lines and associated driving circuitry selectively activate the even columns, while the odd columns remain off in privacy mode. This inversion would achieve a similar directional light-blocking effect, provided the light-blocking lines are properly positioned relative to the new light-emitting columns.

Figure 2A:
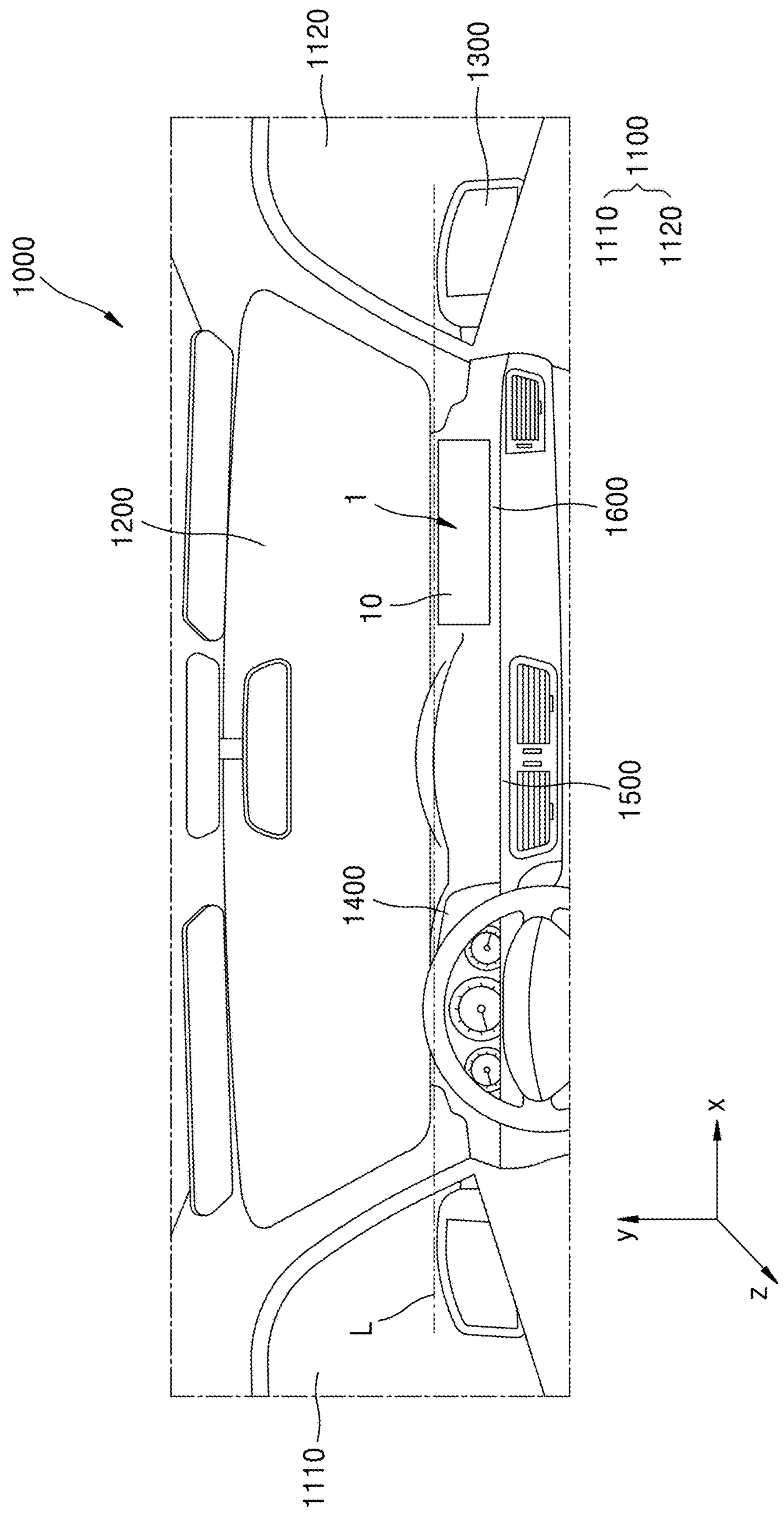
FIG. 2A is a diagram schematically showing the interior of a vehicle, according to an embodiment.
Figure 2B:
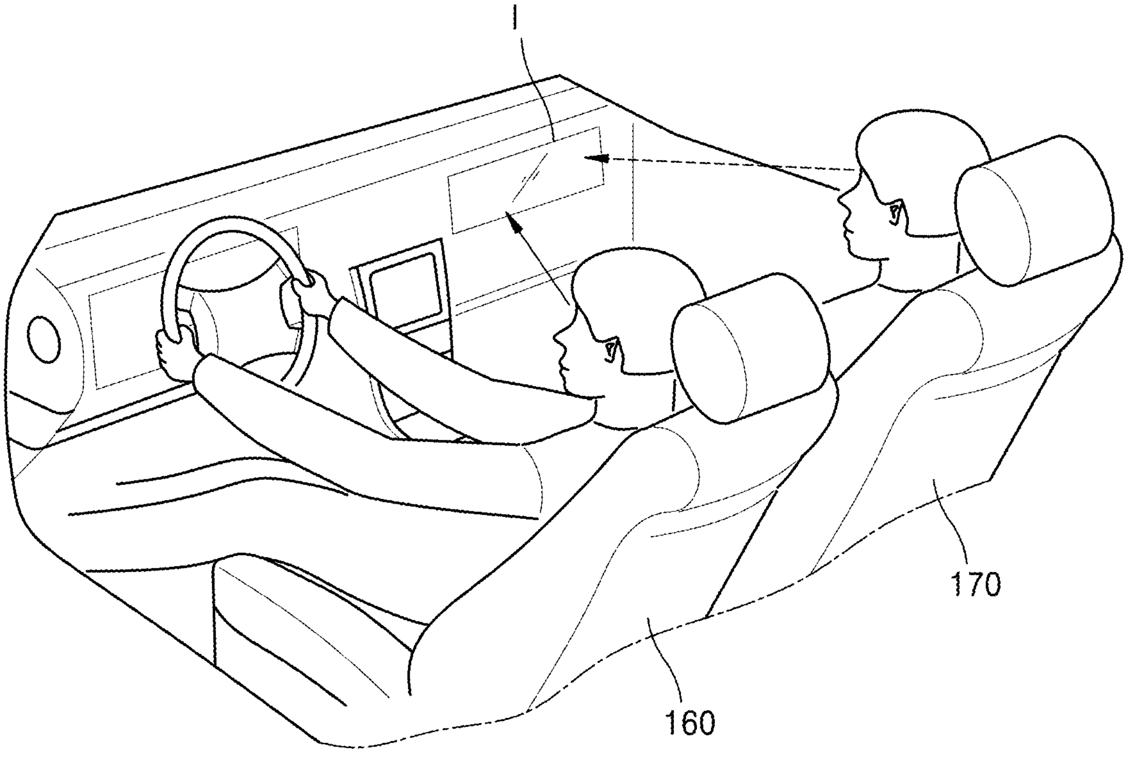
FIG. 2B is a diagram showing a field of vision of a passenger seat display according to an embodiment.

FIG. 1 is a diagram schematically showing the exterior of a vehicle 1000, according to an embodiment. FIG. 2A is a diagram schematically showing the interior of the vehicle 1000, according to an embodiment. FIG. 2B is a diagram showing a field of vision of a passenger seat display according to an embodiment. While the following description refers to a vehicle for convenience of explanation, it will be understood that the display apparatus may be applied to a variety of electronic devices and is not limited to vehicle implementations.

Referring to FIGS. 1, 2A, and 2B, the vehicle 1000 may denote any one of various devices for moving a target to be transported, such as a person, an object, or an animal, from a starting point to a destination. Examples of the vehicle 1000 may include a vehicle traveling on a road or a track, a vessel moving on a sea, ocean, or river, and an airplane flying through the sky by using the action of air.

The vehicle 1000 may travel on a road or a track. The vehicle 1000 may move in a certain direction according to a rotation of at least one wheel. Examples of the vehicle 1000 may include a three-wheeled or four-wheeled vehicle, construction equipment, a two-wheeled vehicle, a motorized device, a bicycle, and a train traveling on a track.

The vehicle 1000 may include a body having an interior and an exterior and a chassis that is a remaining portion excluding the body and on which mechanical devices required for driving are installed. The exterior of the body may include pillars provided at boundaries between a front panel, a hood, a roof panel, a rear panel, a trunk, and doors. The chassis of the vehicle 1000 may include a power generation device, a power transmission device, a driving device, a steering device, a braking device, a suspension device, a transmission device, a fuel device, and front, rear, left, and right wheels.

The vehicle 1000 may include a side window glass 1100, a front window glass 1200, a side mirror 1300, a cluster 1400, a center fascia 1500, a passenger seat dashboard 1600, and a display apparatus 1.

The side window glass 1100 and the front window glass 1200 may be divided by a pillar positioned between the side window glass 1100 and the front window glass 1200.

The side window glass 1100 may be disposed on side surfaces of the vehicle 1000. According to an embodiment, the side window glass 1100 may be disposed in a door of the vehicle 1000. There may be a plurality of side window glasses 1100 and the plurality of side window glasses 1100 may face each other. According to an embodiment, the side window glasses 1100 may include a first side window glass 1110 and a second side window glass 1120. The first side window glass 1110 may be arranged adjacent to the cluster 1400. The second side window glass 1120 may be arranged adjacent to the passenger seat dashboard 1600.

The side window glasses 1100 may be spaced apart from each other in an x-axis direction. For example, the first side window glass 1110 and the second side window glass 1120 may be spaced apart from each other in x direction or a −x direction. In other words, a virtual straight line L connecting the side window glasses 1100 to each other may extend in a first direction (e.g., the −x direction). For example, the virtual straight line L connecting the first side window glass 1110 and the second side window glass 1120 to each other may extend in the first direction (e.g., −x direction) or in a third direction (+x direction) opposite to the first direction. In other words, the side window glasses 1100 may be positioned such that a straight path connecting the first side window glass 1110 and the second side window glass 1120 extends in a first direction (e.g., the −x direction) or in a third direction (e.g., the +x direction), which is opposite to the first direction.

The front window glass 1200 may be disposed the front of the vehicle 1000. The front window glass 1200 may be arranged between the side window glasses 1100 that face each other.

The side mirror 1300 may be configured to provide a rearward field of view of the vehicle 1000. The side mirror 1300 may be disposed on the exterior of the body. According to an embodiment, there may be a plurality of side mirrors 1300. One of the plurality of side mirrors 1300 may be positioned outside the first side window glass 1110. Another one of the plurality of side mirrors 1300 may be positioned outside the second side window glass 1120.

The cluster 1400 may be disposed at the front of a steering wheel. A tachometer, a speedometer, a coolant temperature gauge, a fuel gauge, a turn signal indicator, a high beam indicator, a warning light, a seat belt warning light, a trip meter, a odometer, an automatic transmission selector lever indicator, a door open warning light, an engine oil warning light, and/or a low fuel warning light may be arranged in the cluster 1400.

The center fascia 1500 may include a control panel including a plurality of buttons for adjusting an audio device, an air conditioning device or a seat heater. The center fascia 1500 may be disposed at one side of the cluster 1400.

The passenger seat dashboard 1600 may be spaced apart from the cluster 1400 with the center fascia 1500 therebetween. According to an embodiment, the cluster 1400 may be positioned in alignment with a driver's seat 160, and the passenger seat dashboard 1600 may be positioned in alignment with a passenger seat 170. According to an embodiment, the cluster 1400 may be adjacent to the first side window glass 1110 and the passenger seat dashboard 1600 may be adjacent to the second side window glass 1120.

The display apparatus 1 may be disposed inside the vehicle 1000. The display apparatus 1 may be arranged within the vehicle cabin, including locations such as between the side window glasses 1100 that face each other, in front of the passenger seat 170, on the center console, on a rear surface of a front seat (e.g., 160 or 170) for rear-seat viewing, or in other interior regions where directional light control or privacy display functionality. The display apparatus 1 may be configured to display an image. The display apparatus 1 may be arranged in at least one of the cluster 1400, the center fascia 1500, and the passenger seat dashboard 1600.

The display apparatus 1 may include a liquid crystal display, an electrophoretic display, an organic light-emitting display, an inorganic light-emitting display, a field emission display, a surface-conduction electron-emitter display, a quantum dot display, a plasma display, and a cathode ray display. Hereinafter, an organic light-emitting display is described as an example of the display apparatus 1 according to an embodiment; however, it should be understood that various other types of display apparatuses as described above may also be used in certain embodiments.

According to an embodiment, as shown in FIGS. 2A and 2B, the display apparatus 1 may be arranged in the passenger seat dashboard 1600. The display apparatus 1 may be embedded in the passenger seat dashboard 1600 or located in the passenger seat dashboard 1600. The display apparatus 1 arranged in the passenger seat dashboard 1600 may display an image related to information displayed on the cluster 1400 and/or information displayed on the center fascia 1500. Alternatively, the display apparatus 1 arranged in the passenger seat dashboard 1600 may display information different from the information displayed on the cluster 1400 and/or the information displayed on the center fascia 1500.

According to an embodiment, light emitted from the display apparatus 1 in a privacy mode is emitted in a specific direction. For example, light emitted from the display apparatus 1 arranged in the passenger seat dashboard 1600 may be directed towards the passenger seat 170 and not towards the driver's seat 160. A driver in the driver's seat 160 may not be able to see an image of the display apparatus 1 depending on a driving mode.

Figure 3:
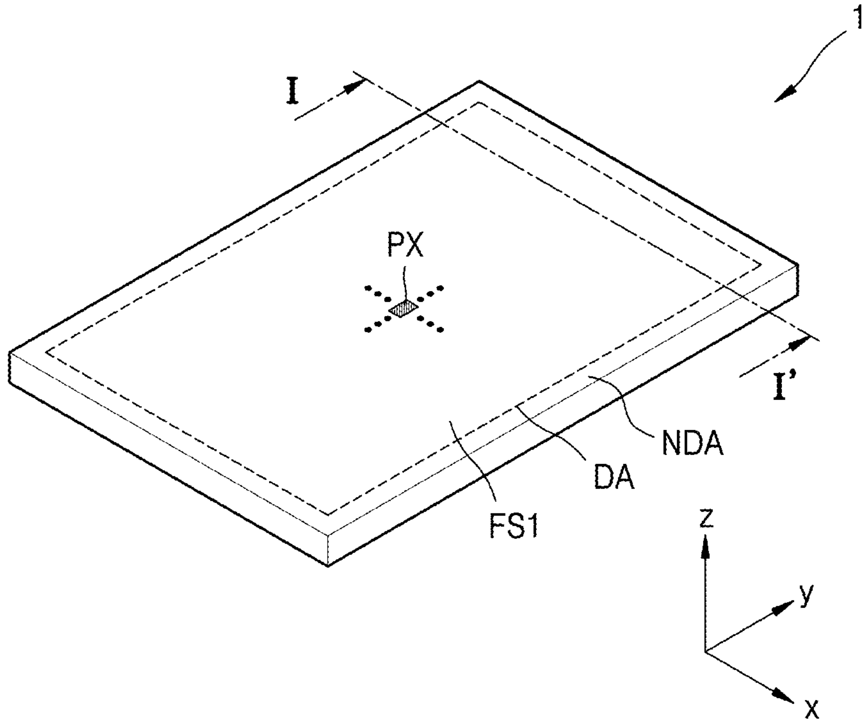
FIG. 3 is a perspective view schematically showing a display apparatus according to an embodiment.

FIG. 3 is a perspective view schematically showing the display apparatus 1 according to an embodiment.

Referring to FIG. 3, the display apparatus 1 may include a display area DA and a non-display area NDA. A sub-pixel PX may be arranged in the display area DA. According to an embodiment, the sub-pixel PX may be arranged on a front surface FS1 of the display apparatus 1.

A plurality of sub-pixels PX may be arranged in the display area DA. The sub-pixel PX may be implemented as a light-emitting element. Light emitted from the sub-pixel PX may not be directed in one specific direction from the front surface FS1 of the display apparatus 1. According to an embodiment, light emitted from the sub-pixel PX may be directed in a direction (e.g., a z direction) perpendicular to the front surface FS1 of the display apparatus 1. Light emitted from the sub-pixel PX may be directed in an oblique direction (for example, in a direction intersecting the z direction) with the front surface FS1 of the display apparatus 1. According to an embodiment, light emitted from the sub-pixel PX may not include a component in the first direction (the −x direction). For example, the emitted light may not propagate in the first direction.

The sub-pixel PX may emit red, green, or blue light by using the light-emitting element. According to an embodiment, the sub-pixel PX may emit red, green, blue, or white light by using the light-emitting element. The sub-pixel PX may be defined as an emission area of the light-emitting element emitting light of any one of colors from among red, green, blue, and white.

The sub-pixel PX may include a light-emitting diode as the light-emitting element configured to emit light of a certain color. According to an embodiment, the light-emitting diode may include, as an emission layer, an organic light-emitting diode including an organic material. According to another embodiment, the light-emitting diode may include an inorganic light-emitting diode. According to another embodiment, the light-emitting diode may include a quantum dot as the emission layer. A size of the light-emitting diode may be in micro-scale or nano-scale. For example, the light-emitting diode may be a micro light-emitting diode. Alternatively, the light-emitting diode may be a nano light-emitting diode. The nano light-emitting diode may include gallium nitride (GaN). Hereinafter, for convenience of description, a case where the light-emitting diode includes an organic light-emitting diode will be mainly described in detail.

The non-display area NDA may be an area where an image is not displayed. The non-display area NDA may surround at least a portion of the display area DA. According to an embodiment, the non-display area NDA may entirely surround the display area DA. According to an embodiment, a driver for providing an electric signal or power to the sub-pixel PX may be arranged in the non-display area NDA. Also, the non-display area NDA may include a pad area in which a pad is arranged.

The non-display area NDA may be arranged outside the display area DA. The non-display area NDA may surround at least a portion of the display area DA. According to an embodiment, the non-display area NDA may entirely surround the display area DA. A driving circuit configured to provide a gate signal to each sub-pixel PX may be arranged in the non-display area NDA. A data driving circuit configured to provide a data signal to each sub-pixel PX may be arranged in the non-display area NDA. The non-display area NDA may include the pad area. The pad may be arranged in the pad area. The pad may be exposed without being covered by an insulating layer, and may be electrically connected to a printed circuit board or a driver integrated circuit (IC). Signals and/or a voltage received from the printed circuit board or driver IC through the pad may be transmitted to each sub-pixel PX arranged in the display area DA through wires connected to the pad.

Figure 4:
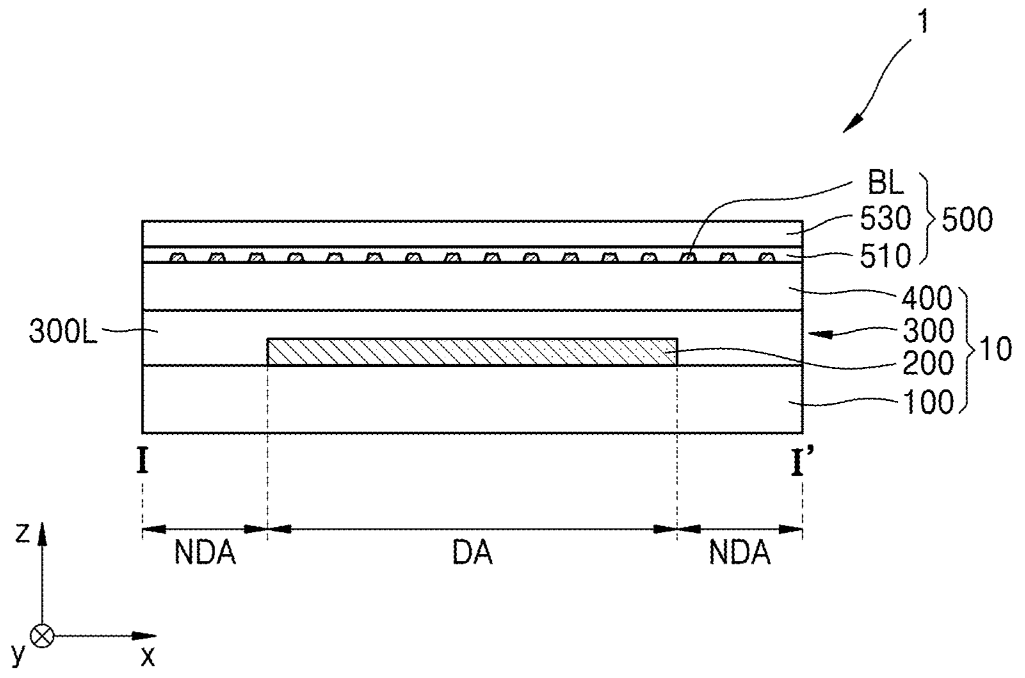
FIG. 4 is a cross-sectional view of the display apparatus taken along a line I-I' of FIG. 3.

FIG. 4 is a cross-sectional view of the display apparatus 1 taken along a line I-I' of FIG. 3.

Referring to FIG. 4, the display apparatus 1 may include a display panel 10 and a light path control layer 500 on the display panel 10. The display panel 10 may include a substrate 100, a display layer 200, an encapsulation member 300, and an anti-reflection layer 400.

The substrate 100 may include glass or a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 may have a multi-layer structure including a base layer including the polymer resin and a barrier layer. The substrate 100 including the polymer resin may be flexible, rollable, or bendable.

The display layer 200 may be disposed on the substrate 100. The display layer 100 may include a sub-pixel circuit layer and a light-emitting element layer. The sub-pixel circuit layer may include a sub-pixel circuit. The sub-pixel circuit may include a transistor and a storage capacitor. The light-emitting element layer may include a light-emitting element connected to the sub-pixel circuit.

The encapsulation member 300 may include an encapsulation layer 300L. The encapsulation layer 300L may include at least one inorganic encapsulation layer and at least one organic encapsulation layer. The at least one inorganic encapsulation layer and the at least one organic encapsulation layer may be alternately stacked on each other.

The at least one inorganic encapsulation layer may include one or more inorganic materials from among an aluminum oxide, a titanium oxide, a tantalum oxide, a zinc oxide, a silicon oxide, a silicon nitride, and a silicon oxynitride. The zinc oxide may include ZnO and/or $ZnO_2$.

The at least one organic encapsulation layer may include a polymer-based material. Examples of the polymer-based material may include an acrylic resin, an epoxy resin, polyimide, and polyethylene. According to an embodiment, the at least one organic encapsulation layer may include acrylate.

The anti-reflection layer 400 may be disposed on the encapsulation member 300. The anti-reflection layer 400 may reduce reflectance of light (for example, external light) incident from the outside towards the display apparatus 1. According to an embodiment, the anti-reflection layer 400 may include a retarder and/or a polarizer. The retarder may be a film type or liquid crystal coating type, and may include a λ/2 retarder and/or a λ/4 retarder. The polarizer may also be a film type or a liquid crystal coating type. The film type may include an elongated synthetic resin film, and the liquid crystal coating type may include liquid crystals arranged in a certain arrangement. The retarder and the polarizer may further include a protection film.

The light path control layer 500 may be disposed on the display panel 10. For example, the light path control layer 500 may be disposed on the anti-reflection layer 400 of the display panel 10. According to an embodiment, an adhesive layer may be provided between the light path control layer 500 and the anti-reflection layer 400. The light path control layer 500 may control a propagating direction of light emitted from the display layer 200. For example, a component of light emitted from the display layer 200 in the first direction (e.g., the −x direction) may be at least partially removed by the light path control layer 500. The light path control layer 500 may include a first layer 510, a plurality of shading lines BL, and a second layer 530. As used herein, the term "shading line" refers to an elongated structure formed of a light-blocking material and disposed on one side of one or more sub-pixels within a display apparatus. The shading line may be part of a light path control layer and may be selectively positioned to limit visibility from undesired viewing angles, such as toward adjacent seats in a vehicle or bystanders in public spaces. The shading line may be referred to as a light-blocking line. The first layer 510 may include transparent resin.

According to an embodiment, the first layer 510 may include a plurality of grooves. The plurality of grooves may be arranged at regular intervals. The plurality of shading lines BL may respectively fill the plurality of grooves. The plurality of shading lines BL may be formed by filling the plurality of grooves with light-blocking materials and applying ultraviolet rays to the light-blocking materials. However, the disclosure is not limited thereto. According to an embodiment, the plurality of shading lines BL are formed and then the first layer 510 is formed on the plurality of shading lines BL.

The plurality of shading lines BL may include a shading material. For example, the plurality of shading lines BL may include a black material. The plurality of shading lines BL may extend in the second direction (e.g., a +y direction). The plurality of shading lines BL may be spaced apart from each other in the first direction (e.g., the −x direction) orthogonal to the second direction (e.g., the +y direction) or in the third direction (e.g. +x direction) opposite to the first direction.

The second layer 530 may be arranged on the first layer 510 and the plurality of shading lines BL. The second layer 530 may include polymer resin. For example, the second layer 530 may include polycarbonate.

Figure 5:
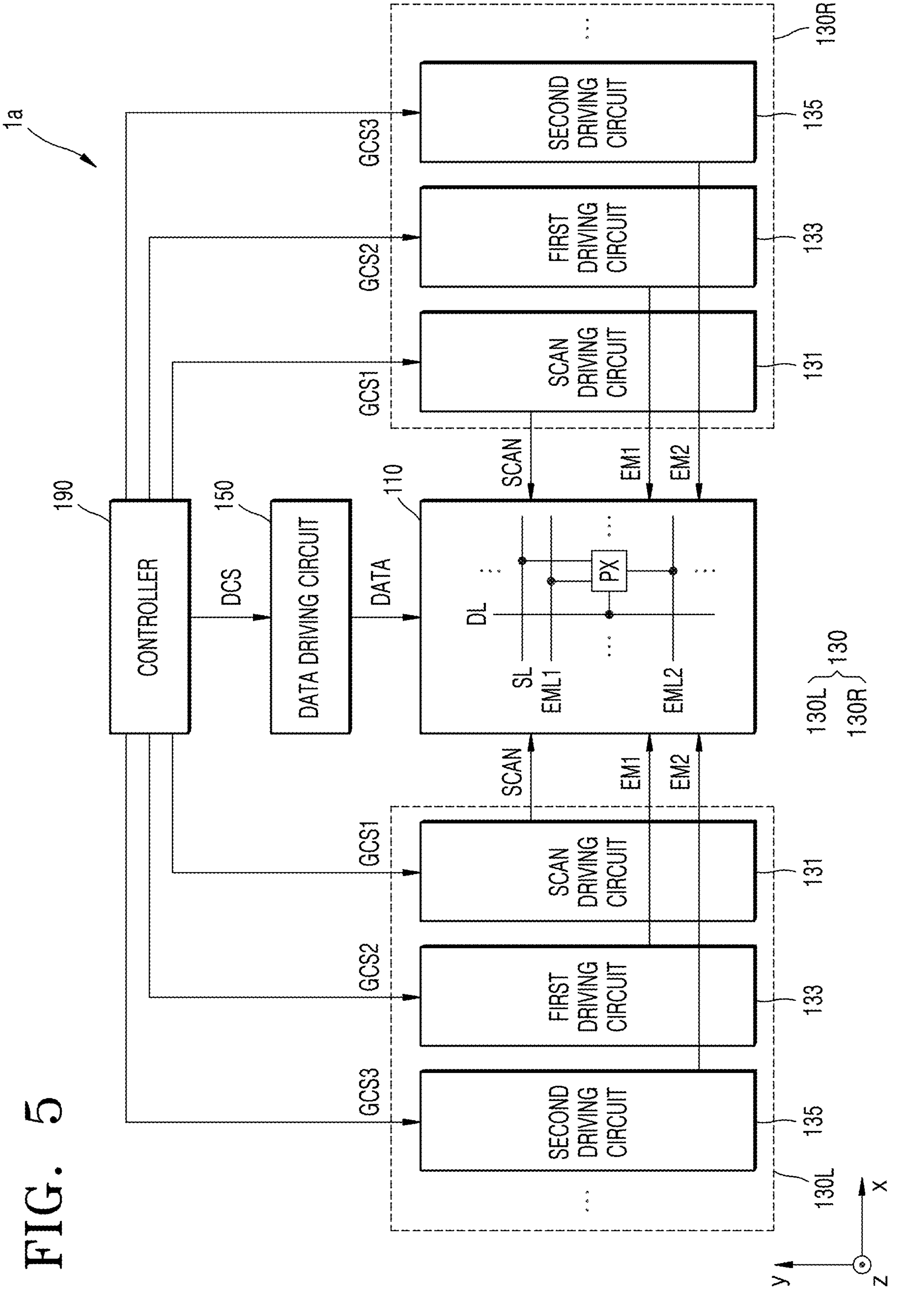
FIG. 5 is a plan view schematically showing a display apparatus according to an embodiment.

FIG. 5 is a plan view schematically showing a display apparatus 1*a* according to an embodiment.

The display apparatus 1*a* of FIG. 5 may be an embodiment of the display apparatus 1 of FIG. 3 or 4. According to an embodiment, the display apparatus 1*a* may include a pixel portion 110, a gate driving circuit 130, a data driving circuit 150, and a controller 190 (e.g., a control circuit).

The pixel portion 110 may be disposed in the display area DA (see FIG. 3). The gate driving circuit 130, the data driving circuit 150, a power supply circuit, and the controller 190 may be disposed in the non-display area NDA (see FIG. 3).

A plurality of gate lines may be spaced apart from each other in the y direction (for example, a column direction) at regular intervals, in the pixel portion 110. The gate lines may each extend in the x direction (for example, a row direction) and be connected to the sub-pixels PX located in a same row (a row line). For example, the gate lines may include first scan lines SL, first gate lines EML1, and second gate lines EML2, and the first scan lines SL, the first gate lines EML1, and the second gate lines EML2 may be arranged in each row.

A plurality of data lines DL may be spaced apart from each other in the x direction at regular intervals, in the pixel portion 110. The data lines DL may each extend in the y direction and be connected to the sub-pixels PX located in a same column (a column line).

The gate driving circuit 130 may be connected to the gate lines and configured to apply a gate signal to the gate lines. The gate line may be connected to a gate of a transistor included in the sub-pixel PX. The gate signal may be a gate control signal controlling the turning on or off of the transistor. The gate signal may be a square wave signal including a gate-on voltage for turning the transistor on, and a gate-off voltage for turning the transistor off. According to an embodiment, the gate-on voltage may be a low-level voltage (a first level voltage) or a high-level voltage (a second level voltage).

The gate driving circuit 130 may include a first gate driving circuit unit 130L arranged in the first direction (−x direction) of the pixel portion 110 and a second gate driving circuit unit 130R arranged in the third direction (+x direction) of the pixel portion 110. For example, the first gate driving circuit 130L may be located to the left of the pixel portion 110 and the second gate driving circuit 130R may be located to the right of the pixel portion 110. According to an embodiment, the first gate driving circuit unit 130L may include a scan driving circuit 131, a first driving circuit 133, and a second driving circuit 135, and the second gate driving circuit unit 130R may include the scan driving circuit 131, the first driving circuit 133, and the second driving circuit 135. The first gate driving circuit unit 130L and the second gate driving circuit unit 130R may each further include at least one gate driving circuit to supply a gate signal to the gate of the transistor included in the sub-pixel PX. In FIG. 5, the gate driving circuit 130 is arranged on left and right sides of the pixel portion 110, but the disclosure is not limited thereto. For example, the gate driving circuit 130 may be arranged only to the left side of the pixel portion 110 or only to the right side of the pixel portion 110.

The scan driving circuits 131 may be connected to the plurality of first scan lines SL and supply a scan signal SCAN to the first scan lines SL according to a first control signal GCS1. The first driving circuit 133 may be connected to the plurality of first gate lines EML1 and supply a first gate signal EM1 to the first gate lines EML1 according to a second control signal GCS2. The second driving circuit 135 may be connected to the plurality of second gate lines EML2 and supply a second gate signal EM2 to the second gate lines EML2 according to a third control signal GCS3. The gate driving circuit 130 may supply a gate signal to the sub-pixels PX of the pixel portion 110 through gate lines.

According to an embodiment, the gate driving circuit 130 may supply a gate signal of the sub-pixels PX to lines selected from among the gate lines. In other words, the gate driving circuit 130 may be a decoder type driving circuit including a plurality of decoder stages. According to an embodiment, the gate driving circuit 130 may receive a plurality of input selection signals, select one of a plurality of gate lines based on turn-on voltage levels of the received input selection signals, and output a gate signal corresponding to the selected gate line. Accordingly, the display apparatus 1 may include the decoder type gate driving circuit 130 to supply a gate signal individually to the sub-pixels PX in a specific area of the pixel portion 110.

The data driving circuit 150 may be connected to the plurality of data lines DL and apply a data signal DATA indicating a grayscale to the data lines DL according to a data control signal DCS. The data driving circuit 150 may convert input image data having a grayscale input from the controller 190 into the data signal DATA in the form of a voltage or current.

The power supply circuit may generate voltages used to drive the sub-pixel PX, according to a power supply control signal. For example, the power supply circuit may generate a first driving voltage and a second driving voltage and supply the same to the sub-pixels PX. The first driving voltage may be a high-level voltage provided to one electrode of a driving transistor connected to a first electrode (a pixel electrode or an anode) of a light-emitting element included in the sub-pixel PX. The second driving voltage may be a low-level voltage provided to a second electrode (an opposite electrode or a cathode) of the light-emitting element included in the sub-pixel PX. The power supply circuit may generate a first initialization voltage and a second initialization voltage and supply the same to the sub-pixels PX. A voltage level of the first driving voltage may be higher than a voltage level of the second driving voltage. Voltage levels of the first initialization voltage and second initialization voltage may be lower than the voltage level of the second driving voltage. Also, the power supply circuit may generate a high-level voltage and a low-level voltage to drive the gate driving circuit 130 and transmit the high-level voltage and the low-level voltage to the gate driving circuit 130.

The controller 190 may generate control signals GCS1, GCS2, GCS3, DCS1, DCS2, DCS3, and DSC based on signals input from an external source, and supply the same to the gate driving circuit 130, the data driving circuit 150, and the power supply circuit. Each of the control signals GCS1, GCS2, and GCS3 output to the gate driving circuit 130 may include a plurality of clock signals and a gate initiation signal. The data control signal DCS output to the data driving circuit 150 may include a data initiation signal and clock signals.

Figure 6:
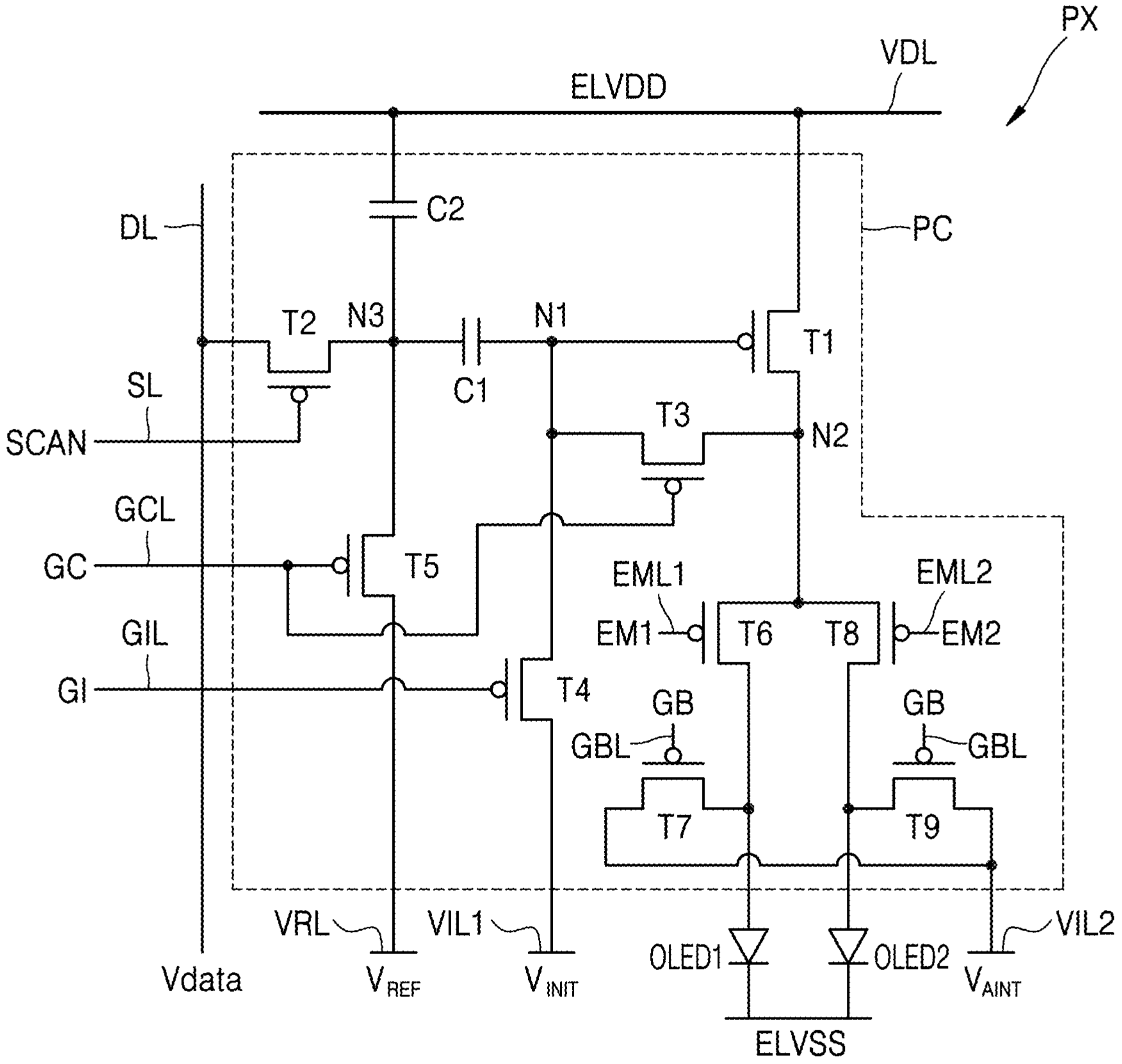
FIG. 6 is an equivalent circuit diagram of a sub-pixel included in a display apparatus, according to an embodiment.

FIG. 6 is an equivalent circuit diagram of the sub-pixel PX included in a display apparatus, according to an embodiment.

Referring to FIG. 6, the sub-pixel PX may include a sub-pixel circuit PC, and a first organic light-emitting diode OLED1 and a second organic light-emitting diode OLED2, which are light-emitting elements connected to the sub-pixel circuit PC. The first organic light-emitting diode OLED1 may emit light when the first gate signal EM1 is supplied to the sub-pixel circuit PC from the first driving circuit 133 (see FIG. 5), and the second organic light-emitting diode OLED2 may emit light when the second gate signal EM2 is supplied to the sub-pixel circuit PC from the second driving circuit 135 (see FIG. 5).

The sub-pixel circuit PC of the sub-pixel PX may include first to ninth transistors T1 to T9, a first capacitor C1, a second capacitor C2, and signal lines electrically connected thereto. The signal lines may include the data line DL, the first scan line SL, the first gate line EML1, the second gate line EML2, a third gate line GIL, a fourth gate line GCL, a fifth gate line GBL, a driving voltage line VDL, a reference voltage line VRL, a first initialization voltage line VIL1, and a second initialization voltage line VIL2.

The first transistor T1 may be a driving transistor in which a size of source-drain current is determined according to a gate-source voltage, and the second to ninth transistors T2 to T9 may be switching transistors that are turned on/off according to the gate-source voltage, for example, a gate voltage. The first to ninth transistors T1 to T9 may be embodied as thin-film transistors. A first terminal of each of the first to ninth transistors T1 to T9 may be a source or a drain, and a second terminal thereof may be a terminal different from the first terminal, depending on a transistor type (p-type or n-type) and/or an operating condition. For example, when the first terminal is a source, the second terminal may be a drain.

The first to ninth transistors T1 to T9 may be a P-type silicon thin-film transistors. A gate-on voltage of a gate signal for turning the first to ninth transistors T1 to T9 on may be a low-level voltage (a second level voltage) and a gate-off voltage of a gate signal for turning the same off may be a high-level voltage (a first level voltage).

The first transistor T1 may be connected between the driving voltage line VDL and the first organic light-emitting diode OLED1 and second organic light-emitting diode OLED2. The first transistor T1 may be connected to the driving voltage line VDL and electrically connected to the first organic light-emitting diode OLED1 via the sixth transistor T6. Also, the first transistor T1 may be electrically connected to the second organic light-emitting diode OLED2 via the eighth transistor T8. The first transistor T1 includes a gate connected to a first node N1, the first terminal connected to the driving voltage line VDL, and the second terminal connected to a second node N2. The first transistor T1 may supply, to the first organic light-emitting diode OLED1 and the second organic light-emitting diode OLED2, a driving current corresponding to a voltage applied to the first node N1, according to a switching operation of the second transistor T2.

The second transistor T2 may be connected between the data line DL and a third node N3. The second transistor T2 may include a gate connected to the first scan line SL, the first terminal connected to the data line DL, and the second terminal connected to the third node N3. The second transistor T2 may be turned on according to the scan signal SCAN received through the first scan line SL and transmit the data signal DATA to the third node N3 through the data line DL.

The third transistor T3 may be connected between the first node N1 and the second node N2. The third transistor T3 may be connected to the first organic light-emitting diode OLED1 via the sixth transistor T6. Also, the third transistor T3 may be connected to the second organic light-emitting diode OLED2 via the eighth transistor T8. The third transistor T3 may include a gate connected to the fourth gate line GCL, the first terminal connected to the second node N2, and the second terminal connected to the first node N1. The third transistor T3 may be turned on according to a fourth gate signal GC received through the fourth gate line GCL and the first transistor T1 may be diode-connected. When the first transistor T1 is diode-connected, a threshold voltage of the first transistor T1 may be compensated for.

The fourth transistor T4 may be connected between the first node N1 and the first initialization voltage line VIL1. The fourth transistor T4 may include a gate connected to the third gate line GIL, the first terminal connected to the first node N1, and the second terminal connected to the first initialization voltage line VIL1. The fourth transistor T4 may be turned on according to a third gate signal GI received through the third gate line GIL to transmit a first initialization voltage $V_{INIT}$ to the first node N1, thereby initializing the first node N1, i.e., the gate of the first transistor T1.

The fifth transistor T5 may be connected between the third node N3 and the reference voltage line VRL. The fifth transistor T5 may include a gate connected to the fourth gate line GCL, the first terminal connected to the third node N3, and the second terminal connected to the reference voltage line VRL. The fifth transistor T5 may be turned on according to the fourth gate signal GC received through the fourth gate line GCL and transmit a reference voltage $V_{REF}$ to the third node N3.

The sixth transistor T6 may be connected between the second node N2 and the first organic light-emitting diode OLED1. The sixth transistor T6 may include a gate connected to the first gate line EML1, the first terminal connected to the second node N2, and the second terminal connected to a sub-pixel electrode of the first organic light-emitting diode OLED1. When the sixth transistor T6 is turned on according to the first gate signal EM1 received through the first gate line EML1, the driving current may flow through the first organic light-emitting diode OLED1.

The seventh transistor T7 may be connected between the first organic light-emitting diode OLED1 and the second initialization voltage line VIL2. The seventh transistor T7 may include a gate connected to the fifth gate line GBL, the first terminal connected to the second terminal of the sixth transistor T6 and the sub-pixel electrode of the first organic light-emitting diode OLED1, and the second terminal connected to the second initialization voltage line VIL2. The seventh transistor T7 may be turned on according to a fifth gate signal GB received through the fifth gate line GBL to initialize the sub-pixel electrode of the first organic light-emitting diode OLED1 by transmitting a second initialization voltage $V_{AINT}$ to the sub-pixel electrode of the first organic light-emitting diode OLED1.

The eighth transistor T8 may be connected between the second node N2 and the second organic light-emitting diode OLED2. The eighth transistor T8 may include a gate connected to the second gate line EML2, the first terminal connected to the second node N2, and the second terminal connected to a sub-pixel electrode of the second organic light-emitting diode OLED2. When the eighth transistor T8 is turned on according to the second gate signal EM2 received through the second gate line EML2, the driving current may flow through the second organic light-emitting diode OLED2.

The ninth transistor T9 may be connected between the second organic light-emitting diode OLED2 and the second initialization voltage line VIL2. The ninth transistor T9 may include a gate connected to the fifth gate line GBL, the first terminal connected to the second terminal of the eighth transistor T8 and the sub-pixel electrode of the second organic light-emitting diode OLED2, and the second terminal connected to the second initialization voltage line VIL2. The ninth transistor T9 may be turned on according to the fifth gate signal GB received through the fifth gate line GBL to initialize the sub-pixel electrode of the second organic light-emitting diode OLED2 by transmitting the second initialization voltage $V_{AINT}$ to the sub-pixel electrode of the second organic light-emitting diode OLED2.

The first capacitor C1 may be connected between the first node N1 and the third node N3. The first capacitor C1 may store a voltage corresponding to a voltage difference between the first node N1 and the third node N3. The first capacitor C1 may be a storage capacitor. The first capacitor C1 may store a threshold voltage of the first transistor T1 and the data signal DATA written through the second transistor T2.

The second capacitor C2 may be connected between the driving voltage line VDL and the third node N3. The second capacitor C2 may store a voltage corresponding to a voltage difference between the driving voltage line VDL and the third node N3. The second capacitor C2 may retain the data signal DATA written through the second transistor T2.

The first organic light-emitting diode OLED1 and the second organic light-emitting diode OLED2 may each include a sub-pixel electrode (e.g., an anode) and an opposite electrode (e.g., a cathode) facing the sub-pixel electrode, and the opposite electrode may receive a second driving voltage ELVSS. The first organic light-emitting diode OLED1 and the second organic light-emitting diode OLED2 may each receive, from the first transistor T1, a driving current corresponding to the data signal DATA to emit light of a certain color, thereby displaying an image.

According to an embodiment, the transistors included in the sub-pixel circuit PC may be P-type transistors. According to an embodiment, the transistors included in a sub-pixel circuit may be N-type transistors or some thereof may be N-type transistors and the remaining thereof may be P-type transistors.

One of these transistors according to an embodiment may be one of an amorphous-silicon (Si) thin-film transistor (TFT), a low temperature poly-silicon (LTPS) TFT, and an oxide TFT. The oxide TFT may include, as a semiconductor layer, an oxide such as amorphous indium-gallium-zinc-oxide (IGZO), zinc oxide (ZnO), or titanium oxide (TiO).

Figure 7A:
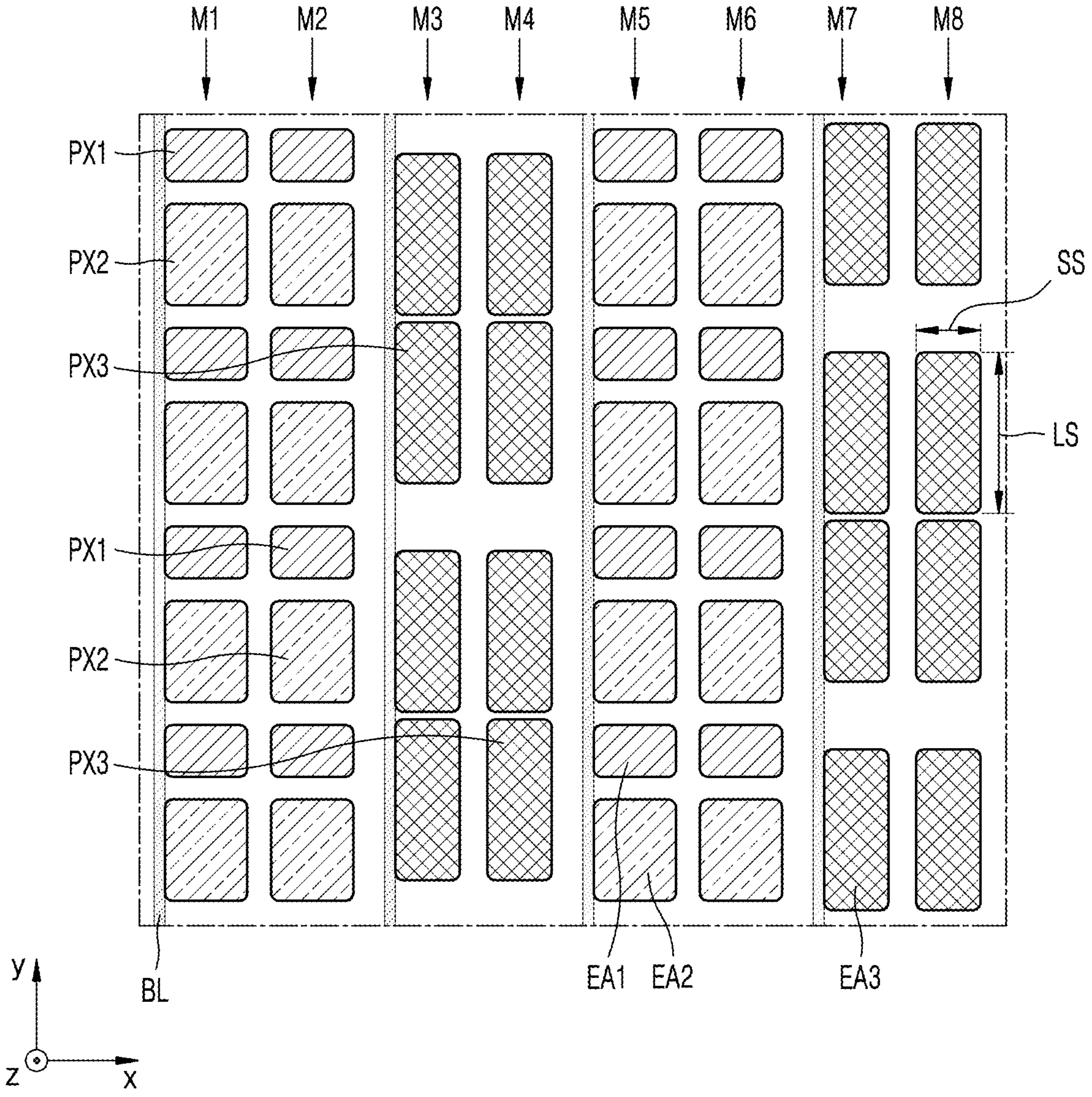
FIG. 7A is a plan view of a portion of a display area of a display apparatus, according to an embodiment.

FIG. 7A is a plan view of a portion of the display area DA of the display apparatus 1, according to an embodiment.

Referring to FIG. 7A, the plurality of sub-pixels PX and the plurality of shading lines BL may be arranged in the display area DA of the display apparatus 1. The plurality of sub-pixels PX may be arranged in the x direction (the row direction) and the y direction (the column direction). The sub-pixels PX of the display area DA may include first sub-pixels PX1 of a first color, second sub-pixels PX2 of a second color, and third sub-pixels PX3 of a third color.

The sub-pixel PX may emit red, green, blue, or white light. The first to third sub-pixels PX1 to PX3 may emit light of different colors. According to an embodiment, the first sub-pixel PX1 may be a red sub-pixel emitting red light, the second sub-pixel PX2 may be a green sub-pixel emitting green light, and the third sub-pixel PX3 may be a blue sub-pixel emitting blue light. However, the disclosure is not limited thereto. According to an embodiment, the first sub-pixel PX1 may be a red sub-pixel, the second sub-pixel PX2 may be a blue sub-pixel, and the third sub-pixel PX3 may be a green sub-pixel.

According to an embodiment, the first sub-pixel PX1, the second sub-pixel PX2, and the third sub-pixel PX3 may each have a rectangular shape. However, the disclosure is not limited thereto. According to an embodiment, the first sub-pixel PX1, the second sub-pixel PX2, and the third sub-pixel PX3 may each have a polygonal shape other than a rectangle, or may have a circular shape or an oval shape. Here, a polygonal shape including a rectangle may include a shape with rounded corners.

According to an embodiment, the third sub-pixel PX3 may have a rectangular shape and include long sides LS extending in the second direction (the +y direction) and short sides SS extending in the first direction (the −x direction). The long sides LS may be longer than the short sides SS.

A size of the sub-pixel PX may be defined as a size of an emission area of a light-emitting element included in the sub-pixel PX. For example, a size of the first sub-pixel PX1 may be defined as a size of a first emission area EA1 of a red organic light-emitting diode as a first light-emitting element. The first emission area EA1 may be an area where the red organic light-emitting diode emits light. A size of the second sub-pixel PX2 may be defined as a size of a second emission area EA2 of a green organic light-emitting diode as a second light-emitting element. The second emission area EA2 may be an area where the green organic light-emitting diode emits light. A size of the third sub-pixel PX3 may be defined as a size of a third emission area EA3 of a blue organic light-emitting diode as a third light-emitting element. The third emission area EA3 may be an area where the blue organic light-emitting diode emits light.

According to an embodiment, an area of the third emission area EA3 may be greater than an area of the first emission area EA1 and an area of the second emission area EA2. This is because, when the third emission area EA3 has a same area as the first emission area EA1, efficiency of a third emission layer 332 (see FIG. 9) of the third sub-pixel PX3 emitting blue light is lower than efficiency of a first emission layer 312 (see FIG. 9) of the first sub-pixel PX1 emitting red light.

According to an embodiment, the first sub-pixel PX1 may be arranged on one side of the third sub-pixel PX3 arranged in an odd column in the first direction (the −x direction) or on one side of the third sub-pixel PX3 arranged in an even column in the third direction (the +x direction). The first sub-pixel PX1 may be spaced apart from the third sub-pixel PX3 in the first direction (the −x direction) or the third direction (the +x direction). Part of the first sub-pixels PX1 may be arranged in first odd and even columns (M1 and M2) in a first row, and part of the third sub-pixels PX3 may be arranged in second odd and even columns (e.g., M3 and M4) to be adjacent the part of the first sub-pixels PX1.

According to an embodiment, the second sub-pixel PX2 may be arranged on one side of the third sub-pixel PX3 arranged in an odd column in the first direction (the −x direction) or on one side of the third sub-pixel PX3 arranged in an even column in the third direction (the +x direction). The second sub-pixel PX2 may be spaced apart from the third sub-pixel PX3 in the first direction (the −x direction) or the third direction (the +x direction). The first sub-pixel PX1 and the second sub-pixel PX2 may be spaced apart from each other. According to an embodiment, the second sub-pixel PX2 may be spaced apart from the first sub-pixel PX1 in the second direction (the +y direction) or in a fourth direction (a −y direction) opposite to the second direction (the +y direction). For example, part of the second sub-pixels PX2 may be arranged in the first odd and even columns in a second row to be adjacent the part of the third sub-pixels PX3.

Referring to FIG. 7A, according to an embodiment, in an entire region of a first column M1 and a second column M2, a set of a pair of first sub-pixels PX1 arranged in the first direction (the −x direction) and a set of a pair of second sub-pixels PX2 arranged in the first direction (the −x direction) may be alternately arranged in the second direction (the +y direction). The plurality of third sub-pixels PX3 may be arranged in a third column M3 adjacent to the second column M2 and in a fourth column M4 adjacent to the third column M3, along the second direction (the +y direction). The third sub-pixels PX3 of the third column M3 may pair with the corresponding third sub-pixels PX3 of the fourth column M4, along the first direction (the −x direction). Such arrangements of the first sub-pixels PX1, the second sub-pixels PX2, and the third sub-pixels PX3 may be repeated along the first direction and/or the second direction.

According to an embodiment, the first sub-pixels PX1 the second sub-pixels PX2, and the third sub-pixels PX3 located in a corresponding odd column each receive the first gate signal EM1 and display an image according to light emission of the first organic light-emitting diode OLED1 (see FIG. 6). In this embodiment, the first sub-pixels PX1, the second sub-pixels PX2, and the third sub-pixels PX3 located in a corresponding even column each receive the second gate signal EM2 and display an image according to light emission of the second organic light-emitting diode OLED2 (see FIG. 6).

The shading line BL may extend in the second direction (the +y direction). There may be a plurality of shading lines BL. In a plan view, the plurality of shading lines BL may be located on only one side of the sub-pixels PX arranged in each odd column in the first direction (the −x direction) from among the plurality of sub-pixels PX in the display area DA. For example, while the shading lines BL are depicted as being located to the left of the sub-pixels PX arranged in each odd column, in an alternate embodiment, they may be located to the right of the sub-pixels PX arranged in each odd column. The shading lines BL may be arranged to at least partially overlap or be adjacent to the sub-pixels PX in the odd column. In an embodiment, a relatively small number of shading lines BL is arranged in a limited location, and thus, luminance reduction of the first sub-pixel PX1, the second sub-pixel PX2, and the third sub-pixel PX3 caused by the shading lines BL may be minimized. For example, while FIG. 7A illustrates shading lines BL disposed adjacent to each odd-numbered column for clarity, it will be understood that shading lines may be provided only in selected areas or part of the display to achieve directional light control while minimizing luminance reduction. In a further alternate embodiment, the shading lines BL are located to one side of the sub-pixels PX arranged in each even column.

The plurality of shading lines BL may prevent or reduce light emitted from each of the first sub-pixel PX1, the second sub-pixel PX2, and the third sub-pixel PX3 located in the odd column from propagating in a direction of the shading lines BL, i.e., in the first direction (the −x direction). Accordingly, light emitted from each of the first sub-pixel PX1, the second sub-pixel PX2, and the third sub-pixel PX3 located in the odd column is unable to propagate in a specific direction. For example, a component in the first direction (the −x direction) may be removed from light emitted from each of the first sub-pixel PX1, the second sub-pixel PX2, and the third sub-pixel PX3 located in the odd column.

According to an embodiment, a display apparatus may be arranged on the passenger seat dashboard 1600 (see FIG. 2A). Light emitted from the sub-pixels PX located in the odd column from among the sub-pixels PX included in the display area DA of the display apparatus is unable to proceed in the −x direction (e.g., to the left) corresponding to the first direction, due to the shading lines BL. In other words, light emitted from the sub-pixels PX located in the odd column should not reach the driver's seat 160 (see FIG. 2B) located in the first direction (the −x direction) from the passenger seat dashboard 1600.

According to an embodiment, the first driving circuit 133 (see FIG. 5) supplies a first gate signal that is a turn-on signal to the first gate lines EML1 connected to the sub-pixels PX in the odd column from among the sub-pixels PX, based on a privacy mode control signal (e.g., indicating entering a privacy mode) from the controller 190 (see FIG. 5). The turn-on signal may activate these sub-pixels PX in the odd column. Also, the second driving circuit 135 (see FIG. 5) may supply a second gate signal that is a turn-off signal to the second gate lines EML2 connected to the sub-pixels PX in the even column from among the sub-pixels PX, based on the privacy mode control signal from the controller 190 (see FIG. 5). The turn-off signal may deactivate the sub-pixels PX in the even column. Accordingly, only the sub-pixels PX in the odd column may emit light in a privacy mode. Accordingly, an image of the display apparatus should not be observable from the driver's seat 160 (see FIG. 2B) located in the −x direction of the display apparatus.

In an embodiment, the first driving circuit 133 (see FIG. 5) supplies the first gate signal that is a turn-off signal to the first gate lines EML1 connected to the sub-pixels PX in the odd column from among the sub-pixels PX, based on a public mode control signal (e.g., indicating entering public mode or exiting private mode) from the controller 190 (see FIG. 5). The turn-off signal may deactivate the sub-pixels PX in the odd column. In an embodiment, the second driving circuit 135 (see FIG. 5) supplies the second gate signal that is a turn-on signal to the second gate lines EML2 connected to the sub-pixels PX in the even column from among the sub-pixels PX, based on the public mode control signal from the controller 190 (see FIG. 5). The turn-on signal may activate the sub-pixels PX in the even column. In a public mode, only the sub-pixels PX in the even column, spaced apart from the shading lines BL, may emit light, unlike the privacy mode.

Figure 7B:
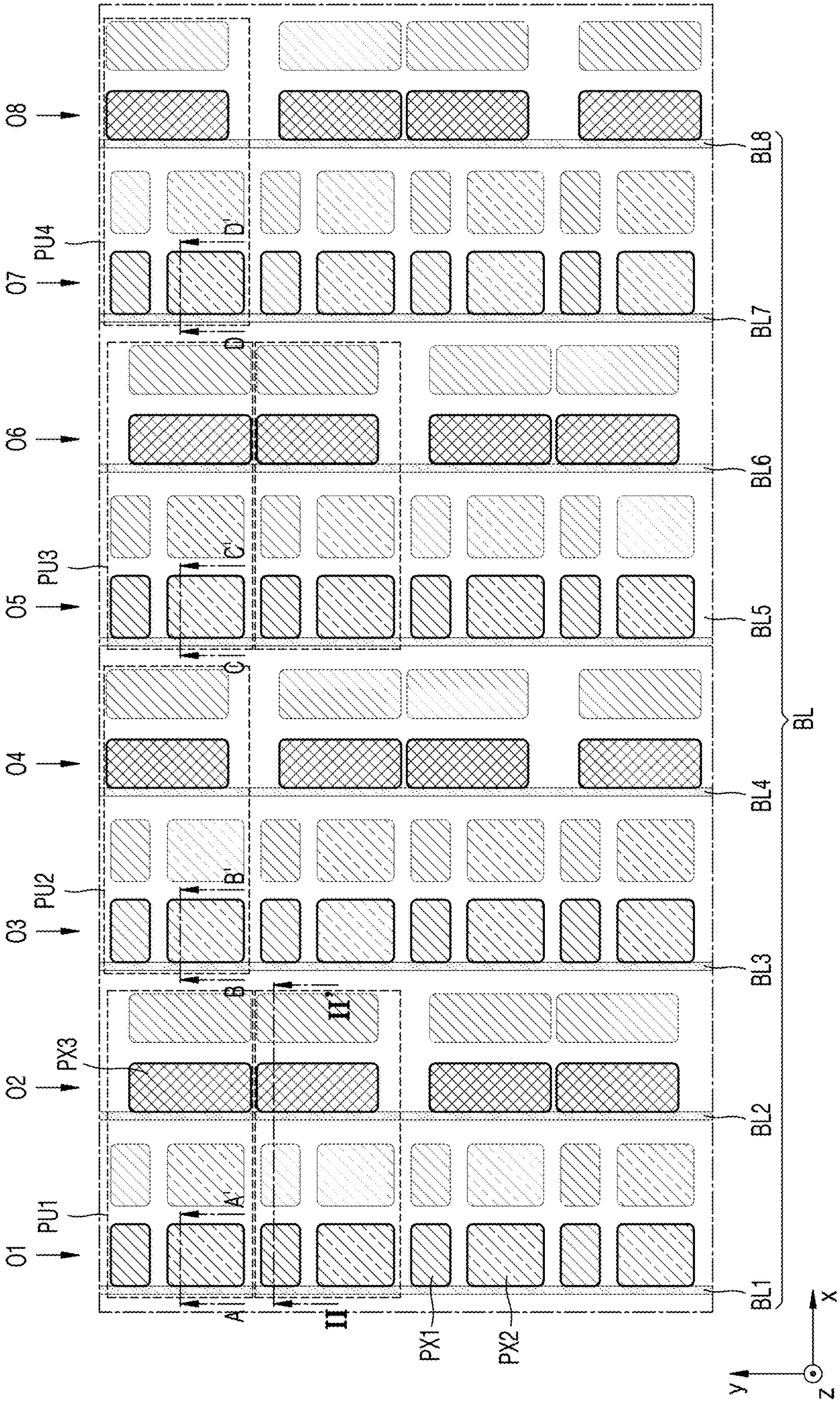
FIG. 7B is a plan view of a portion of a display area of a display apparatus, according to an embodiment.

FIG. 7B is a plan view of a portion of the display area DA of a display apparatus, according to an embodiment. FIG. 7B is an excerpt of the shading lines BL and the sub-pixels PX in the odd column, which operate in the privacy mode, from among the sub-pixels PX of FIG. 7A.

Referring to FIG. 7B, among the plurality of sub-pixels PX, the sub-pixels PX in the odd column may include a plurality of unit pixels PU each including the first sub-pixel PX1, the second sub-pixel PX2, and the third sub-pixel PX3. The plurality of unit pixels PU may be arranged in the x direction (the row direction) and the y direction (the column direction).

In the present specification, a unit pixel refers to a unit of a pixel including only sub-pixels in an odd column from among sub-pixels.

According to an embodiment, the unit pixel may include one first sub-pixel PX1, one second sub-pixel PX2, and one third sub-pixel PX3. However, the disclosure is not limited thereto. The number of sub-pixels PX included in the unit pixel may exceed three as long as light emitted from certain sub-pixels PX is mixed to emit white light.

For convenience of description, one unit pixel from among the unit pixels PU in the display area DA will be referred to as a first unit pixel PU1, and unit pixels arranged on a same row as the first unit pixel PU1 and sequentially arranged in the third direction (the +x direction) from the first unit pixel PU1 will be referred to as a second unit pixel PU2, a third unit pixel PU3, and a fourth unit pixel PU4. The first to fourth unit pixels PU1 to PU4 may be arranged on different columns.

According to an embodiment, each unit pixel may include the first sub-pixel PX1 and the second sub-pixel PX2, which are arranged on an odd column, and the third sub-pixel PX3 arranged on an even column adjacent to the odd column. For example, the first unit pixel PU1 may include the first sub-pixel PX1 and the second sub-pixel PX2, which are arranged along a first odd column O1, and the third sub-pixel PX3 arranged along a second odd column O2. The second unit pixel PU2 may include the first sub-pixel PX1 and the second sub-pixel PX2, which are arranged along a third odd column O3, and the third sub-pixel PX3 arranged along a fourth odd column O4. The third unit pixel PU3 may include the first sub-pixel PX1 and the second sub-pixel PX2, which are arranged along a fifth odd column O5, and the third sub-pixel PX3 arranged along a sixth odd column O6. The fourth unit pixel PU4 may include the first sub-pixel PX1 and the second sub-pixel PX2, which are arranged along a seventh odd column O7, and the third sub-pixel PX3 arranged along an eighth odd column O8.

At least two shading lines BL may be arranged corresponding to one unit pixel. Here, the shading lines BL corresponding to one unit pixel may denote the shading lines BL located on one side of each of the sub-pixels PX included in one unit pixel in the first direction (the −x direction).

According to an embodiment, two shading lines BL may be arranged corresponding to one unit pixel. For example, a first shading line BL1 and a second shading line BL2 may be arranged corresponding to the first unit pixel PU1. A third shading line BL3 and a fourth shading line BL4 may be arranged corresponding to the second unit pixel PU2. A fifth shading line BL5 and a sixth shading line BL6 may be arranged corresponding to the third unit pixel PU3. A seventh shading line BL7 and an eighth shading line BL8 may be arranged corresponding to the fourth unit pixel PU4. The first shading line BL1 to the eighth shading line BL8 may be shading lines BL respectively arranged on one sides of the sub-pixels PX on the first odd column O1 to the eighth odd column O8 in the first direction (the −x direction). For example, the first shading line BL1 may be arranged to the left of the sub-pixels PX on the first odd column O1, the second shading line BL2 may be arranged to the left of the sub-pixels PX on the second odd column O2, the third shading line BL3 may be arranged to the left of the sub-pixels PX on the third odd column O3, etc. However, in an alternative embodiment, the first shading line BL1 may be arranged to the right of the sub-pixels PX on the first odd column O1, the second shading line BL2 may be arranged to the right of the sub-pixels PX on the second odd column O2, the third shading line BL3 may be arranged to the right of the sub-pixels PX on the third odd column O3, etc.

Arrangements of sub-pixels and shading lines shown in FIGS. 7A and 7B are only examples and the disclosure is not limited thereto. The arrangement of the sub-pixels PX, the numbers and arrangements of the first sub-pixel PX1, the second sub-pixel PX2, and the third sub-pixel PX3 included in the unit pixel PU, and the number of shading lines BL corresponding to the unit pixel PU may be variously modified and designed according to implementation requirements.

According to an embodiment, each of the shading lines BL may continuously extend corresponding to the plurality of unit pixels PU arranged on a same column. For example, each shading line BL may extend continuously as a single uninterrupted line or rectangle in a column. For example, FIGS. 7A and 7B illustrates each of the shading lines BL extending corresponding to all unit pixels PU arranged on a same column. However, the disclosure is not limited thereto. According to an embodiment, each of the shading lines BL may include a plurality of portions that are spaced apart from each other and extend corresponding to one or more unit pixels PU arranged on a same column. For example, in this embodiment, instead of being one continuous line or rectangle, each shading line BL is made up of multiple separate segments that are spaced apart from one another in the y direction.

Figure 8A:
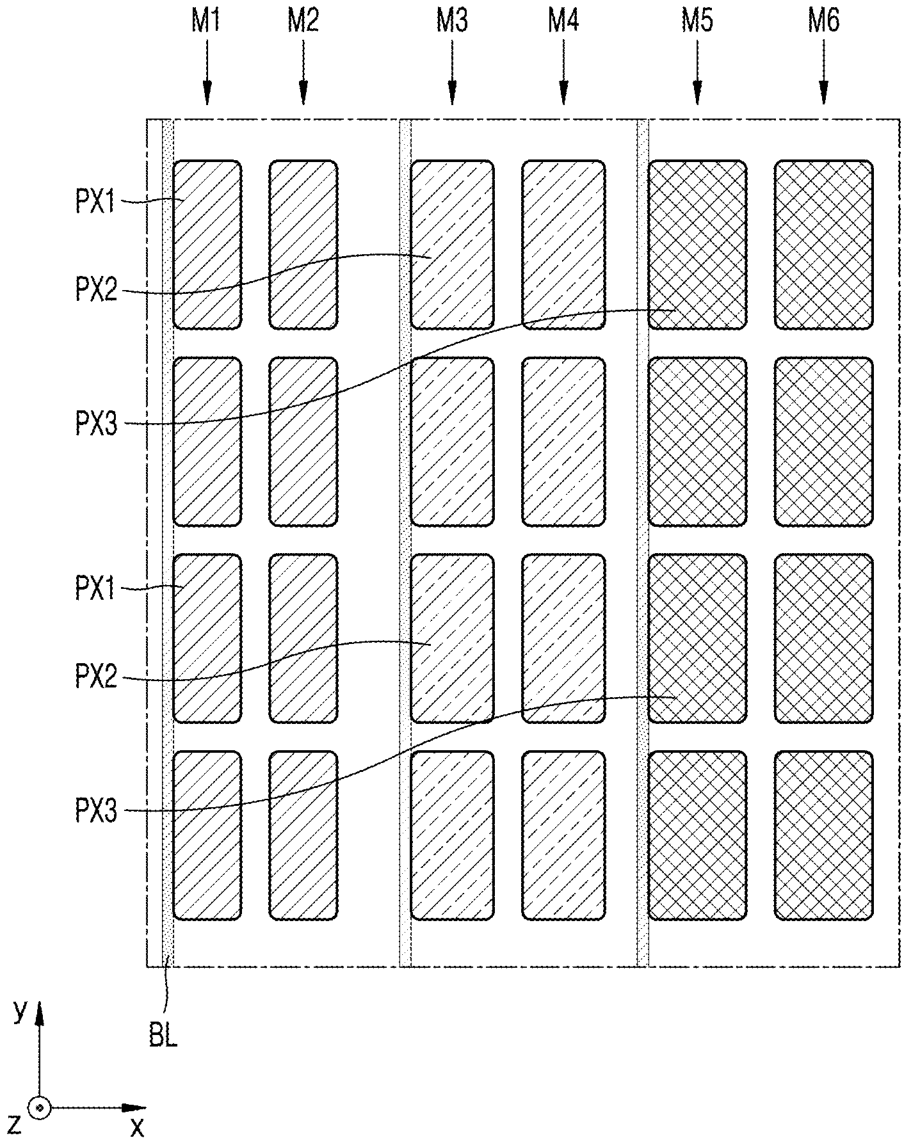
FIG. 8A is a plan view of a portion of a display area of a display apparatus, according to an embodiment.

FIG. 8A is a plan view of a portion of the display area DA of a display apparatus, according to an embodiment. FIG. 8A is a modified embodiment of FIG. 7A, and hereinafter, redundant descriptions will be omitted and only differences will be mainly described.

Referring to FIG. 8A, the plurality of sub-pixels PX and the plurality of shading lines BL may be arranged in the display area DA. The sub-pixels PX of the display area DA may include the first sub-pixels PX1 of the first color, the second sub-pixels PX2 of the second color, and the third sub-pixels PX3 of the third color.

According to an embodiment, the first sub-pixel PX1, the second sub-pixel PX2, and the third sub-pixel PX3 may have rectangular shapes. For example, the first sub-pixel PX1, the second sub-pixel PX2, and the third sub-pixel PX3 may be the same size. Each of the first sub-pixel PX1, the second sub-pixel PX2, and the third sub-pixel PX3 may have long sides extending in the second direction (the +y direction) and short sides extending in the first direction (the −x direction).

According to an embodiment, the first sub-pixel PX1 may be arranged on one side of the second sub-pixel PX2 arranged in an odd column in the first direction (the −x direction) or on one side of the third sub-pixel PX3 arranged in an even column in the third direction (the +x direction).

The first sub-pixel PX1 may be spaced apart from the second sub-pixel PX2 in the first direction (the −x direction) and spaced apart from the third sub-pixel PX3 in the third direction (the +x direction). For example, the first sub-pixels PX1 may be arranged in two columns M1 and M2 and spaced apart from the second sub-pixels PX2 that are arranged in two columns M3 and M4. A shading line BL may be disposed to the left of the first column M1.

According to an embodiment, the second sub-pixel PX2 may be arranged on one side of the first sub-pixel PX1 arranged in an even column in the third direction (the +x direction) or on one side of the third sub-pixel PX3 arranged in an odd column in the first direction (the −x direction). The second sub-pixel PX2 may be spaced apart from the first sub-pixel PX1 in the third direction (the +x direction) or spaced apart from the third sub-pixel PX3 in the first direction (the −x direction). For example, the second sub-pixels PX2 may be arranged in two columns M3 and M4 between the first sub-pixels PX1 and the third sub-pixels PX3 that are arranged in two columns M5 and M6. A shading line BL may be disposed to the left of the third column M3 and to the left of the fifth column M5.

Referring to FIG. 8A, according to an embodiment, the plurality of first sub-pixels PX1 may be arranged along the second direction (the +y direction) in the first column M1 and the second column M2 adjacent to the first column M1. The first sub-pixels PX1 of the first column M1 may pair with the corresponding first sub-pixels PX1 of the second column M2, along the first direction (the −x direction). The plurality of second sub-pixels PX2 may be arranged in the third column M3 adjacent to the second column M2 and in the fourth column M4 adjacent to the third column M3, along the second direction (the +y direction). The second sub-pixels PX2 of the third column M3 may pair with the corresponding second sub-pixels PX2 of the fourth column M4, along the first direction (the −x direction). The third sub-pixels PX3 may be arranged in a fifth column M5 adjacent to the fourth column M4 and in a sixth column M6 adjacent to the fifth column M5, along the second direction (the +y direction). The third sub-pixels PX3 of the fifth column M5 may pair with the corresponding third sub-pixels PX3 of the sixth column M6, along the first direction (the −x direction). Such arrangements of the first sub-pixels PX1, the second sub-pixels PX2, and the third sub-pixels PX3 may be repeated along the first direction and/or the second direction. For example, the first sub-pixels PX1 may be arranged again in seventh and eight columns after the sixth column M6, the second sub-pixels PX2 may be arranged again in ninth and tenth columns after the eighth column, and the third sub-pixels PX3 may be arranged again in eleventh and twelfth columns after the tenth column.

Figure 8B:
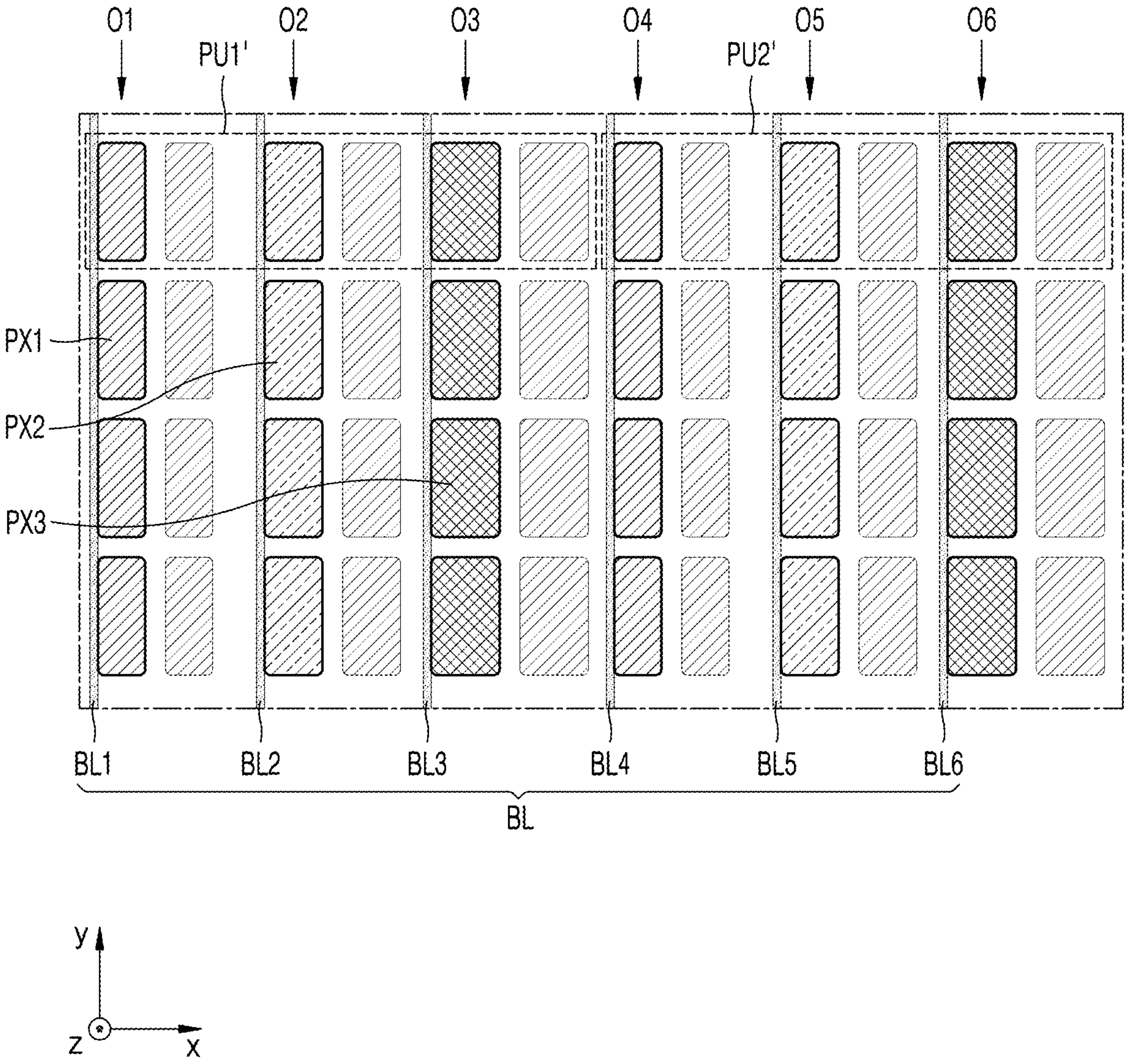
FIG. 8B is a plan view of a portion of a display area of a display apparatus, according to an embodiment.

FIG. 8B is a plan view of a portion of the display area DA of a display apparatus, according to an embodiment. FIG. 8B is an excerpt of the shading lines BL and the sub-pixels PX in the odd column, which operate in the privacy mode, from among the sub-pixels PX of FIG. 8A.

Referring to FIG. 8B, according to an embodiment, each unit pixel may include one first sub-pixel PX1, one second sub-pixel PX2, and one third sub-pixel PX3.

For convenience of description, one unit pixel from among the unit pixels arranged in the display area DA will be referred to as a first unit pixel PU1' and the unit pixel PU adjacent to the first unit pixel PU1' in the third direction (the +x direction) will be referred to as a second unit pixel PU2'.

According to an embodiment, each unit pixel may include the first sub-pixel PX1 arranged in a first column, the second sub-pixel PX2 arranged in a second column adjacent to the first column, and the third sub-pixel PX3 arranged in a third column adjacent to the second column. For example, the first unit pixel PU1' may include the first sub-pixel PX1 arranged along the first odd column O1, the second sub-pixel PX2 arranged along the second odd column O2, and the third sub-pixel PX3 arranged along the third odd column O3. The second unit pixel PU2' may include the first sub-pixel PX1 arranged along the fourth odd column O4, the second sub-pixel PX2 arranged along the fifth odd column O5, and the third sub-pixel PX3 arranged along the sixth odd column O6.

According to an embodiment, three shading lines BL may be arranged corresponding to one unit pixel PU. For example, the first shading line BL1, the second shading line BL2, and the third shading line BL3 may be arranged corresponding to the first unit pixel PU1'. The fourth shading line BL4, the fifth shading line BL5, and the sixth shading line BL6 may be arranged corresponding to the second unit pixel PU2'. The first shading line BL1 to the sixth shading line BL6 may be shading lines BL respectively arranged on one sides of the sub-pixels PX on the first odd column O1 to the sixth odd column O6 in the first direction (the −x direction).

Figure 9:
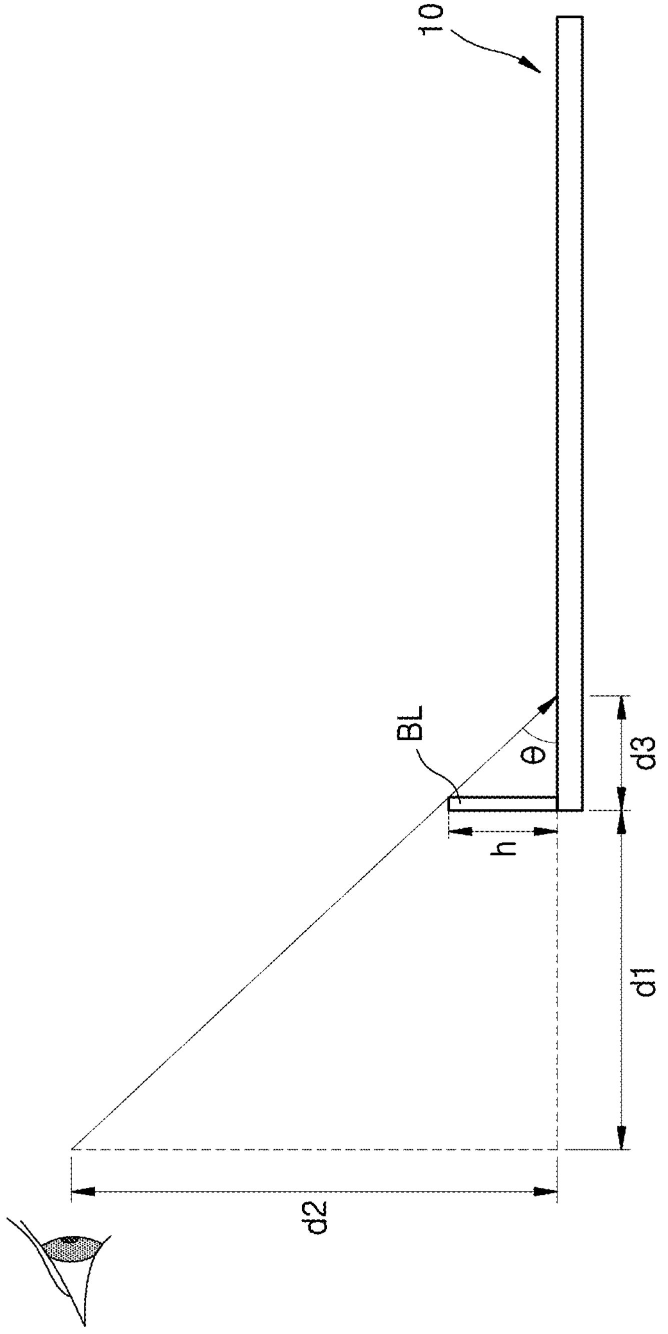
FIG. 9 is a schematic diagram showing a light-blocking line of a display apparatus and a field of vision of a driver, according to an embodiment.

FIG. 9 is a schematic diagram showing the shading line BL of a display apparatus and a field of vision of a driver, according to an embodiment.

Referring to FIG. 9, when the display apparatus is arranged on the passenger seat dashboard 1600 (see FIG. 2A) of a vehicle, a thickness (e.g., a z direction thickness) of the shading line BL may be set considering a location and field of vision of the driver. The plurality of shading lines BL may be arranged on the display panel 10 included in the display apparatus. In FIG. 9, for convenience of description, only one shading line BL arranged adjacent to an edge of the display panel 10 in the first direction (the −x direction) is illustrated.

A threshold value of a thickness h of the shading line BL may be designed by using Equation 1 below. In the present specification, the thickness h of the shading line BL may denote the z direction thickness perpendicular to the second direction (the +y direction) in which the shading line BL extends.

$$h=d2/d1+d3\times d3=\tan\theta\times d3 \qquad (1)$$

Here, h may denote the thickness of the shading line BL, d1 may denote a distance of the driver with respect to the display panel 10 in the first direction (the −x direction), d2 may denote a +z direction distance of (the eyes of) the driver with respect to the display panel 10, θ may denote a viewing angle of the driver, and d3 may denote a distance of a region covered by the shading lines BL with respect to the display panel 10 in the first direction (the −x direction).

The shading line BL is designed to remove a component of light in the first direction (the −x direction), emitted from sub-pixels in adjacent odd columns. Thus, the distance d3 of the region covered by the shading line BL with respect to the display panel 10 in the first direction (the −x direction) may be the same as or greater than a width of one sub-pixel in the first direction (the −x direction).

For example, when d1 is 0.3 m, d2 is 1 m, and d3 is 15 um, the thickness h of the shading line BL closest to the driver may be designed to be about 50 um or more.

Figure 10:
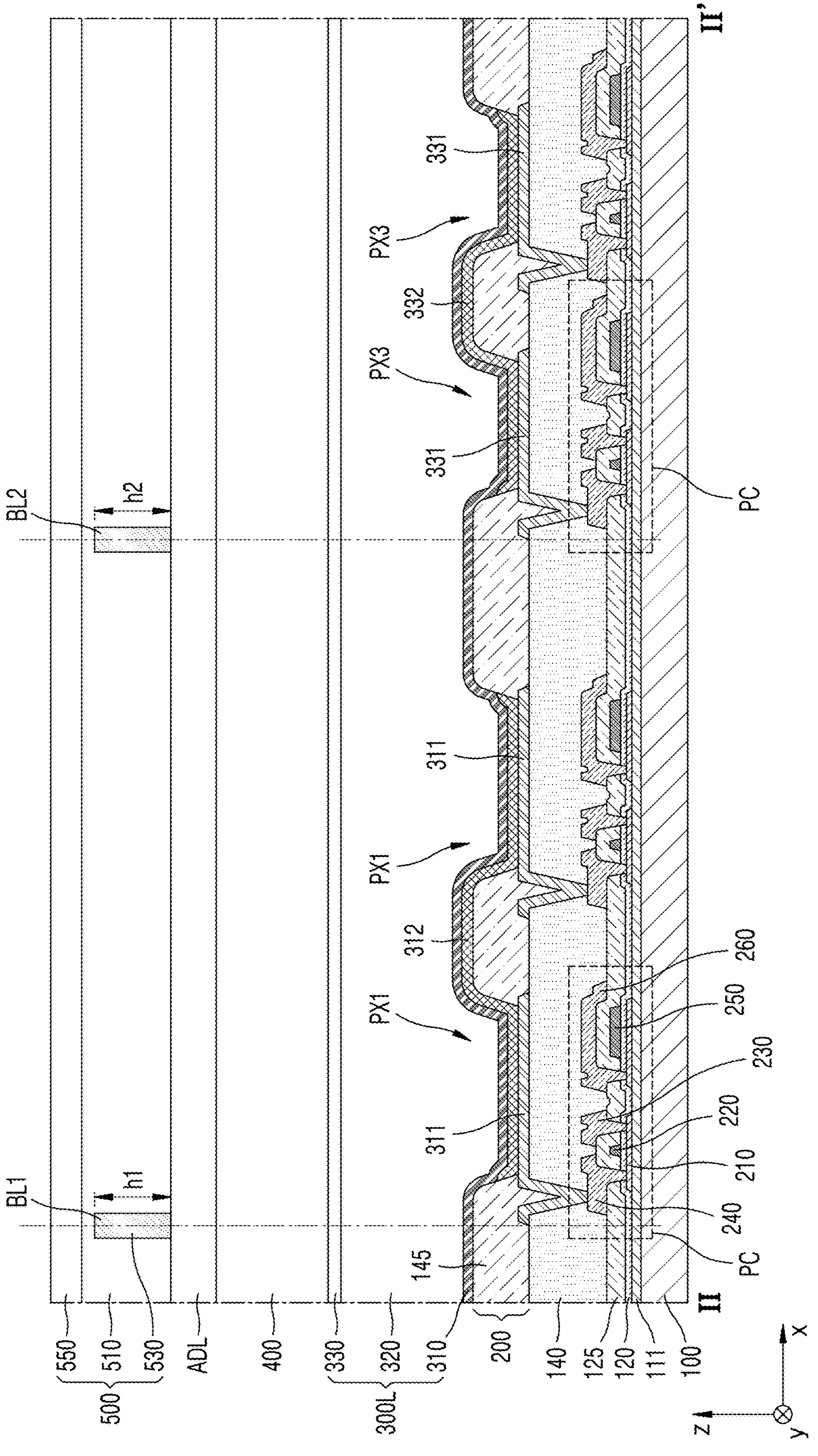
FIG. 10 is a cross-sectional view of the display apparatus taken along a line II-II' of FIG. 7B, according to an embodiment.
Figure 11A:
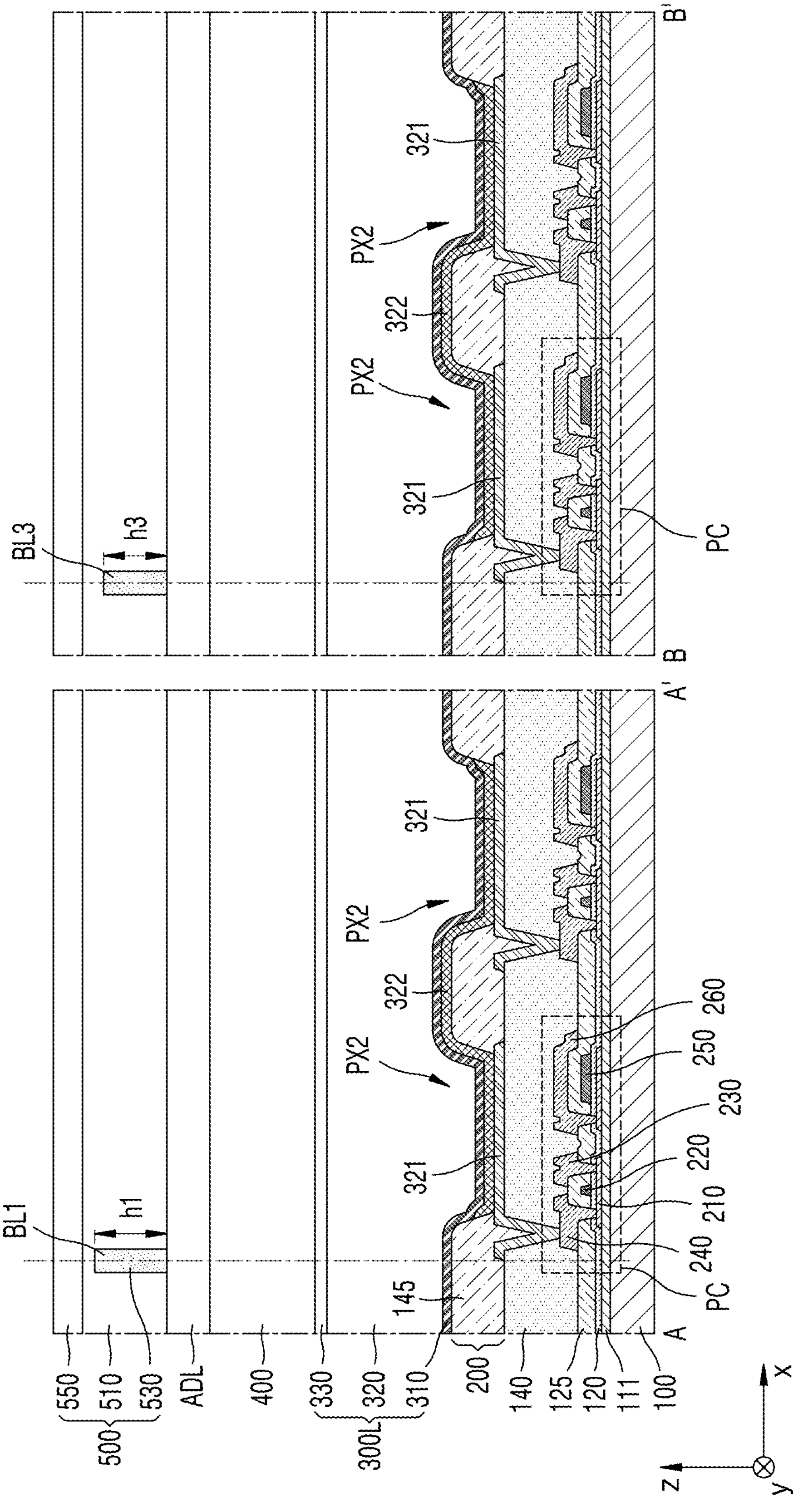
FIG. 11A is a cross-sectional view of the display apparatus taken along a line A-A' and a line B-B' of FIG. 7B, according to an embodiment.
Figure 11B:
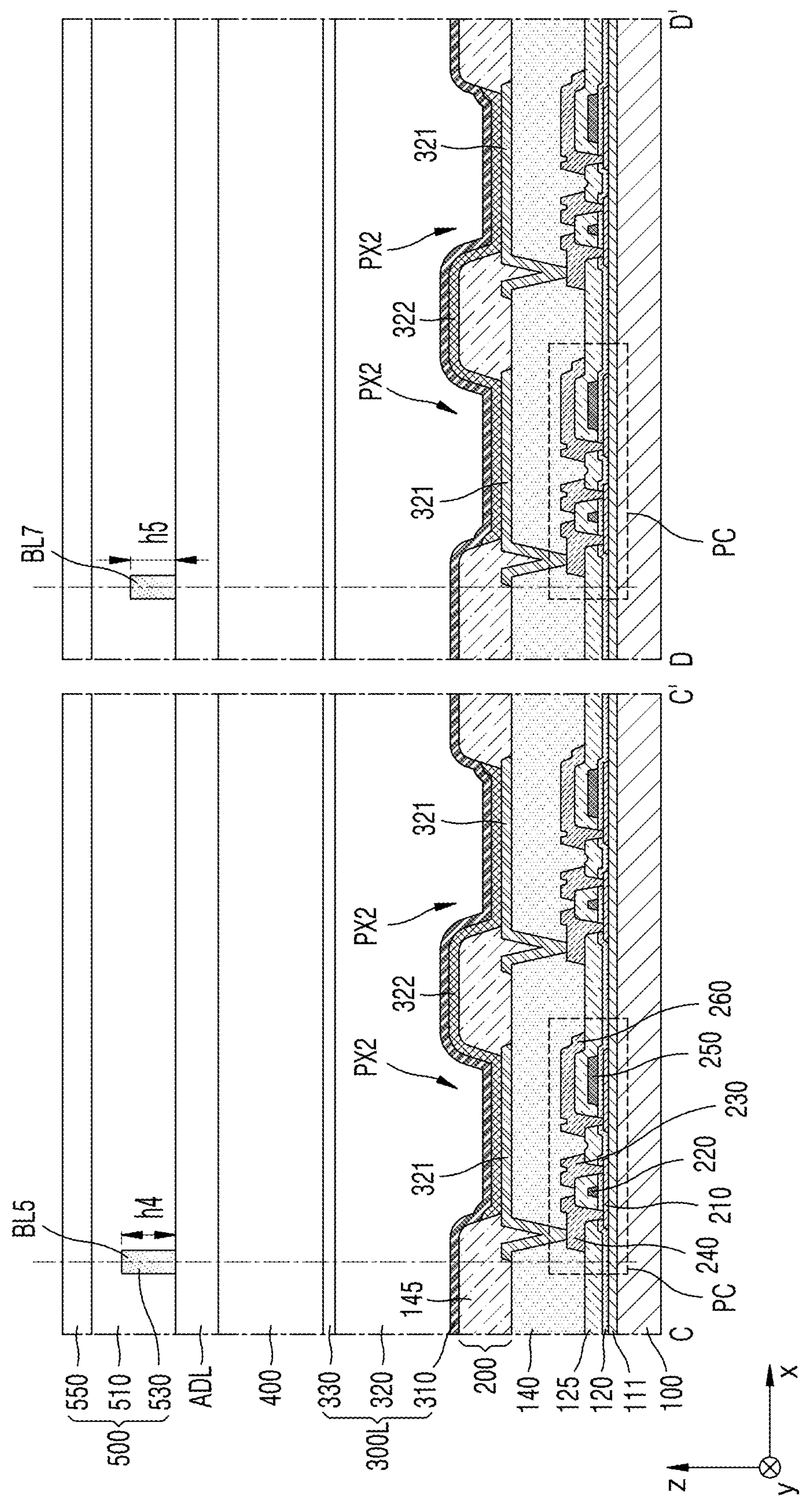
FIG. 11B is a cross-sectional view of the display apparatus taken along a line C-C' and a line D-D' of FIG. 7B, according to an embodiment.

FIG. 10 is a cross-sectional view of the display apparatus 1 taken along a line II-II' of FIG. 7B, according to an embodiment, FIG. 11A is a cross-sectional view of the display apparatus 1 taken along a line A-A' and a line B-B' of FIG. 7B, according to an embodiment, and FIG. 11B is a cross-sectional view of the display apparatus 1 taken along a line C-C' and a line D-D' of FIG. 7B, according to an embodiment.

Referring to FIGS. 10, 11A, and 11B, a first sub-pixel electrode 311, a second sub-pixel electrode 321, and a third sub-pixel electrode 331 may be arranged on a planarization layer 140. A bank layer 145 may be arranged on such sub-pixel electrodes. An opening exposing a center portion of each sub-pixel electrode may be defined in the bank layer 145, and the bank layer 145 may cover an edge of each sub-pixel electrode. The sub-pixels PX shown in FIG. 8A or FIG. 8B may respectively correspond to the openings of the bank layer 145. In other words, portions exposed by the openings of the bank layer 145 of the first sub-pixel electrodes 311 may be the first sub-pixels PX1, portions exposed by the openings of the bank layer 145 of the second sub-pixel electrodes 321 may be the second sub-pixels PX2, and portions exposed by the openings of the bank layer 145 of the third sub-pixel electrodes 331 may be the third sub-pixels PX3.

The sub-pixels PX may be controlled by the sub-pixel circuits PC respectively and electrically connected to the sub-pixels PX. As shown in FIG. 10, the sub-pixel circuit PC may include a thin-film transistor including a semiconductor layer 210, a gate electrode 220, a source electrode 230, and a drain electrode 240, and a capacitor including a lower electrode 250 and an upper electrode 260.

The sub-pixel circuits PC may be arranged on the substrate 100. A buffer layer 111 including silicon oxide, silicon nitride, or silicon oxynitride, may be arranged on the substrate 100. The buffer layer 111 may planarize a top surface of the substrate 100. The substrate 100 may include a display area DA and a peripheral area (e.g., non-display area NDA) arranged outside the display area DA.

The semiconductor layer 210 may be arranged on the buffer layer 111. The semiconductor layer 210 may include amorphous silicon or polysilicon. The semiconductor layer 210 may include an oxide semiconductor material in some embodiments.

A gate insulating layer 120 may be arranged on the substrate 100 while covering the semiconductor layer 210. The gate insulating layer 120 may include an insulating material. For example, the gate insulating layer 120 may include an inorganic insulating layer such as silicon oxide, silicon nitride, silicon oxynitride, or aluminum oxide.

The gate electrode 220 and/or the lower electrode 250 of the capacitor may be arranged on the gate insulating layer 120. When the gate electrode 220 and the lower electrode 250 are arranged on the gate insulating layer 120, the gate electrode 220 and the lower electrode 250 may have a same layer structure and include a same material. For example, the gate electrode 220 and the lower electrode 250 may have a two-layer structure of molybdenum (Mo)/aluminum (Al) including a layer containing Mo and a layer containing Al, or a three-layer structure of Mo/Al/Mo.

An interlayer insulating layer 125 may be arranged on the gate insulating layer 120 while covering the gate electrode 220 and the lower electrode 250. The interlayer insulating layer 125 may include an insulating material. For example, the interlayer insulating layer 125 may include silicon oxide, silicon nitride, silicon oxynitride, or aluminum oxide.

The source electrode 230, the drain electrode 240, and/or the upper electrode 260 of the capacitor may be arranged on the interlayer insulating layer 125. The source electrode 230, the drain electrode 240, and the upper electrode 260 may have a same layer structure and include a same material. For example, the source electrode 230, the drain electrode 240, and the upper electrode 260 may have a three-layer structure of titanium (Ti)/Al/Ti by including a layer containing Ti and a layer containing Al.

The planarization layer 140 may be arranged on the interlayer insulating layer 125 while covering the source electrode 230, the drain electrode 240, and the upper electrode 260. The planarization layer 140 may include an organic insulating material. For example, the planarization layer 140 may include photoresist, benzocyclobutene (BCB), polyimide, hexamethyldisiloxane (HMDSO), polymethylmethacrylate (PMMA), polystyrene, a polymer derivative having a phenol-based group, acryl-based polymer, imide-based polymer, arylether-based polymer, amide-based polymer, fluorine-based polymer, p-xylene-based polymer, vinyl alcohol-based polymer, or a compound thereof.

The display layer 200 may be arranged on the planarization layer 140. The display layer 200 may include a sub-pixel electrode, an emission layer, and an opposite electrode. The sub-pixel electrodes of the display layer 200 may be spaced apart from each other and the opposite electrode may be integrated throughout the display layer 200. The emission layer may have a shape patterned corresponding to the sub-pixel electrodes. A first functional layer, such as a hole transport layer (HTL) and/or a hole injection layer (HIL), may be disposed between the sub-pixel electrode and the emission layer. A second functional layer, such as an electron transport layer (ETL) and/or an electron injection layer (EIL), may be disposed between the emission layer and the opposite electrode. The first functional layer and/or the second functional layer may be integrated throughout the display layer 200. In FIG. 10, for convenience, the first functional layer, the second functional layer, and the opposite electrode are not illustrated.

Referring to FIG. 10, the first sub-pixels PX1 may include the first sub-pixel electrode 311 and the first emission layer 312 arranged on the first sub-pixel electrode 311 and emitting light of a first color. The second sub-pixels PX2 may include the second sub-pixel electrode 321 and a second emission layer 322 arranged on the second sub-pixel electrode 321 and emitting light of a second color. The third sub-pixels PX3 may include the third sub-pixel electrode 331 and the third emission layer 332 arranged on the third sub-pixel electrode 331 and emitting light of a third color.

The bank layer 145 may be arranged on the planarization layer 140 to cover edges of the sub-pixel electrodes. The bank layer 145 may include at least one organic insulating material from among polyimide, polyamide, acryl resin, benzocyclobutene, and phenol resin, and may be formed through spin coating.

The sub-pixel electrode may be a (semi-)transmissive electrode or a reflective electrode. For example, the sub-pixel electrode may include a reflective layer including Ag, Mg, Al, Pt, Pd, Au, Ni, Nd, Ir, Cr, or a compound thereof, and a transparent or semi-transparent electrode layer on the reflective layer. The transparent or semi-transparent electrode layer may include at least one of indium tin oxide (ITO), indium zinc oxide (IZO), zinc oxide (ZnO or $ZnO_2$), indium oxide ($In_2O_3$), indium gallium oxide (IGO), and aluminum zinc oxide (AZO). For example, the sub-pixel electrode may have a three-layer structure of ITO/Ag/ITO.

The opposite electrode may be a transmissive electrode or a reflective electrode. For example, the opposite electrode may be a transparent or (semi-) transparent electrode, and include a metal thin film with a low work function, including lithium (Li), calcium (Ca), lithium fluoride (LiF), Al, gold (Ag), magnesium (Mg), or a compound thereof. The opposite electrode may include a transparent or semi-transparent electrode layer arranged on a metal thin film. In this case, the transparent or semi-transparent electrode layer may include at least one of ITO, IZO, ZnO or $ZnO_2$, $In_2O_3$, IGO, and AZO. The opposite electrode may be integrated for a plurality of pixels and arranged above the emission layer and above the bank layer 145.

The encapsulation member 300 (see FIG. 4) may be arranged on the display layer 200. The encapsulation member 300 (see FIG. 4) may include the encapsulation layer 300L. The encapsulation layer 300L may include at least one inorganic encapsulation layer and at least one organic encapsulation layer. According to an embodiment, the encapsulation layer 300L may include a first inorganic encapsulation layer 310, an organic encapsulation layer 320, and a second inorganic encapsulation layer 330, which are sequentially stacked on each other.

The anti-reflection layer 400 may be arranged on the encapsulation layer 300L.

The light path control layer 500 may be arranged on the anti-reflection layer 400. An adhesive layer ADL may be disposed between the light path control layer 500 and the anti-reflection layer 400. The adhesive layer ADL may be a clear adhesive member, such as an optically clear adhesive (OCA).

The light path control layer 500 may include the first layer 510, the plurality of shading lines BL, and the second layer 530. The plurality of shading lines BL may be spaced apart from each other in the x direction.

Referring to FIGS. 8B and 10, according to an embodiment, the shading lines BL corresponding to one unit pixel from among the plurality of shading lines BL may have a same thickness. For example, in the first shading line BL1 and the second shading line BL2, which correspond to the first unit pixel PU1, a thickness h1 of the first shading line BL1 may be the same as a thickness h2 of the second shading line BL2. In other words, the shading lines BL corresponding to one unit pixel from among the plurality of shading lines BL may have a same height.

The third shading line BL3 and the fourth shading line BL4, which correspond to the second unit pixel PU2, may have a same thickness. The fifth shading line BL5 and the sixth shading line BL6, which correspond to the third unit pixel PU3, may have a same thickness. The seventh shading line BL7 and the eighth shading line BL8, which correspond to the fourth unit pixel PU4, may have a same thickness.

According to an embodiment, the shading lines BL corresponding to one unit pixel from among the plurality of shading lines BL may have a same width. Here, the width of the shading line BL may denote a width in the first direction (the −x direction) perpendicular to the second direction (the +y direction) in which the shading line BL extends. For example, a width of the first shading line BL1 may be the same as a width of the second shading line BL2.

Referring to FIGS. 11A and 11B, according to an embodiment, the shading lines BL respectively corresponding to the unit pixels PU arranged in different columns may have thicknesses gradually decreasing along the third direction (the +x direction) opposite to the first direction (the −x direction).

As described above with reference to FIG. 9, considering the viewing angle of the driver at the driver's seat 160 (see FIG. 2B), the thickness of the shading line BL corresponding to the unit pixel PU closest to the driver's seat 160 may be the greatest, and the thicknesses of the shading lines BL respectively corresponding to the unit pixels PU in different columns may gradually decrease in the third direction (the +x direction) away from the driver's seat 160.

For example, as shown in FIG. 11A, a thickness h3 of the third shading line BL3 corresponding to the second unit pixel PU2 may be less than the thickness h1 of the first shading line BL1 corresponding to the first unit pixel PU1. For example, as shown in FIGS. 11A and 11B, a thickness h4 of the fifth shading line BL5 corresponding to the third unit pixel PU3 may be less than the thickness h3 of the third shading line BL3 corresponding to the second unit pixel PU2. For example, as shown in FIG. 11B, a thickness h5 of the seventh shading line BL7 corresponding to the fourth unit pixel PU4 may be less than the thickness h4 of the fifth shading line BL5 corresponding to the third unit pixel PU3.

A display apparatus according to an embodiment includes the plurality of shading lines BL to block light from undesired viewing angles, such as light directed toward the driver's field of vision from the display apparatus arranged in front of the passenger seat 170 (see FIG. 2B) so that the light does not interfere with the driver while driving the vehicle.

In a comparative example, when thicknesses of a plurality of shading lines are the same regardless of locations, a white graduation phenomenon may occur due to a difference in amounts of light reaching a driver for each location of the display apparatus, according to a viewing angle of the driver. Also, when the thicknesses of the plurality of shading lines are designed differently regardless of a unit pixel, a color staining phenomenon may occur due to a difference in colors realized by each unit pixel.

However, according to an embodiment, the thicknesses of the plurality of shading lines BL may vary depending on their location. For example, the shading lines BL may be designed to increase in thickness towards the driver's seat, thereby helping to reduce differences in the amount of light perceived from different locations on the display apparatus based on the driver's viewing angle. Thus, a white graduation phenomenon of the display apparatus may be reduced. In addition, manufacturing costs of the plurality of shading lines BL may be reduced.

Also, according to an embodiment, the shading lines BL corresponding to one unit pixel have a same thickness, thereby preventing color differences between unit pixels and ensuring uniform color representation across the display. Accordingly, display quality of the display apparatus may be enhanced.

Figure 12A:
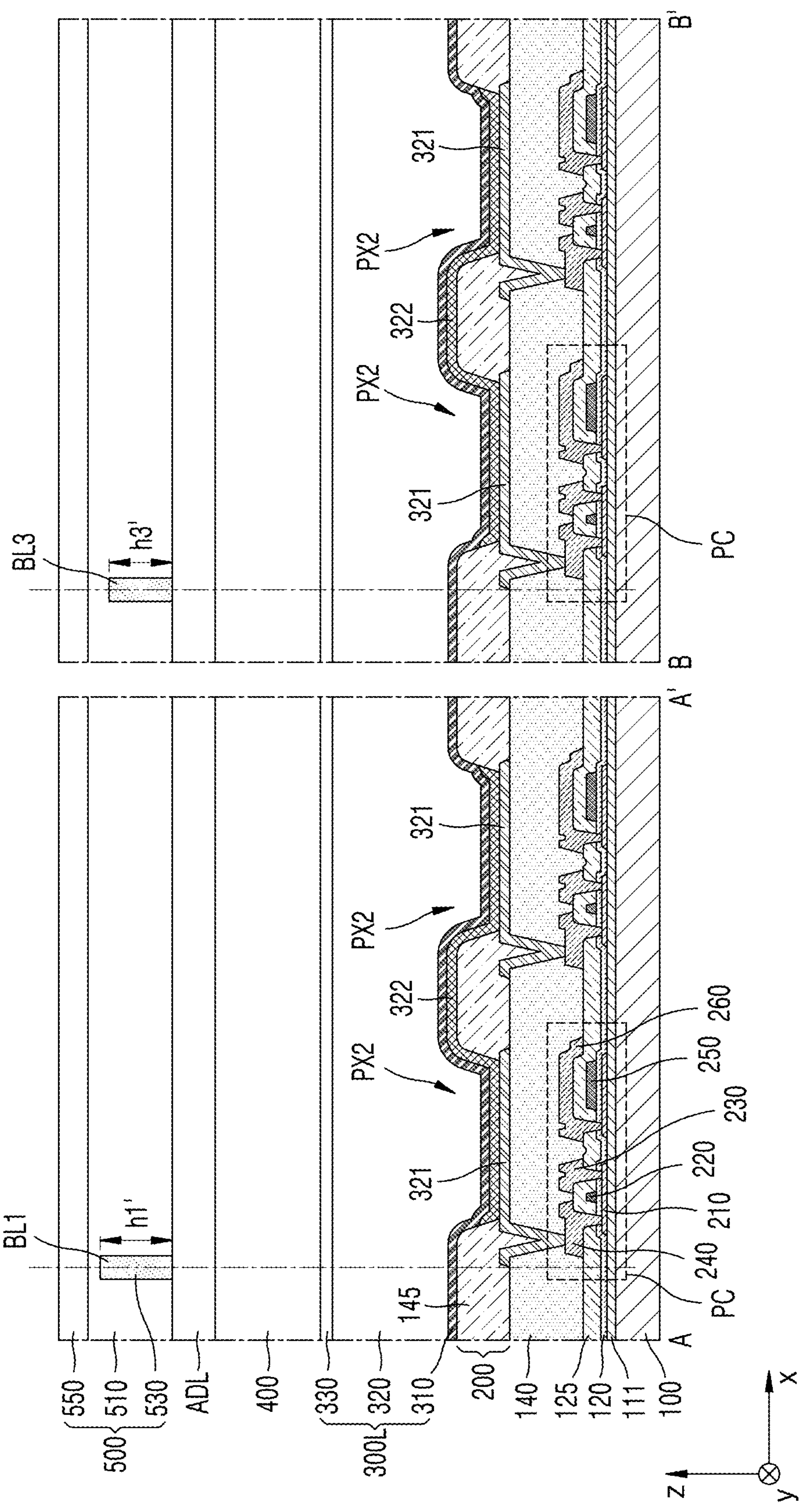
FIG. 12A is a cross-sectional view of the display apparatus taken along the line A-A' and the line B-B' of FIG. 7B, according to an embodiment.
Figure 12B:
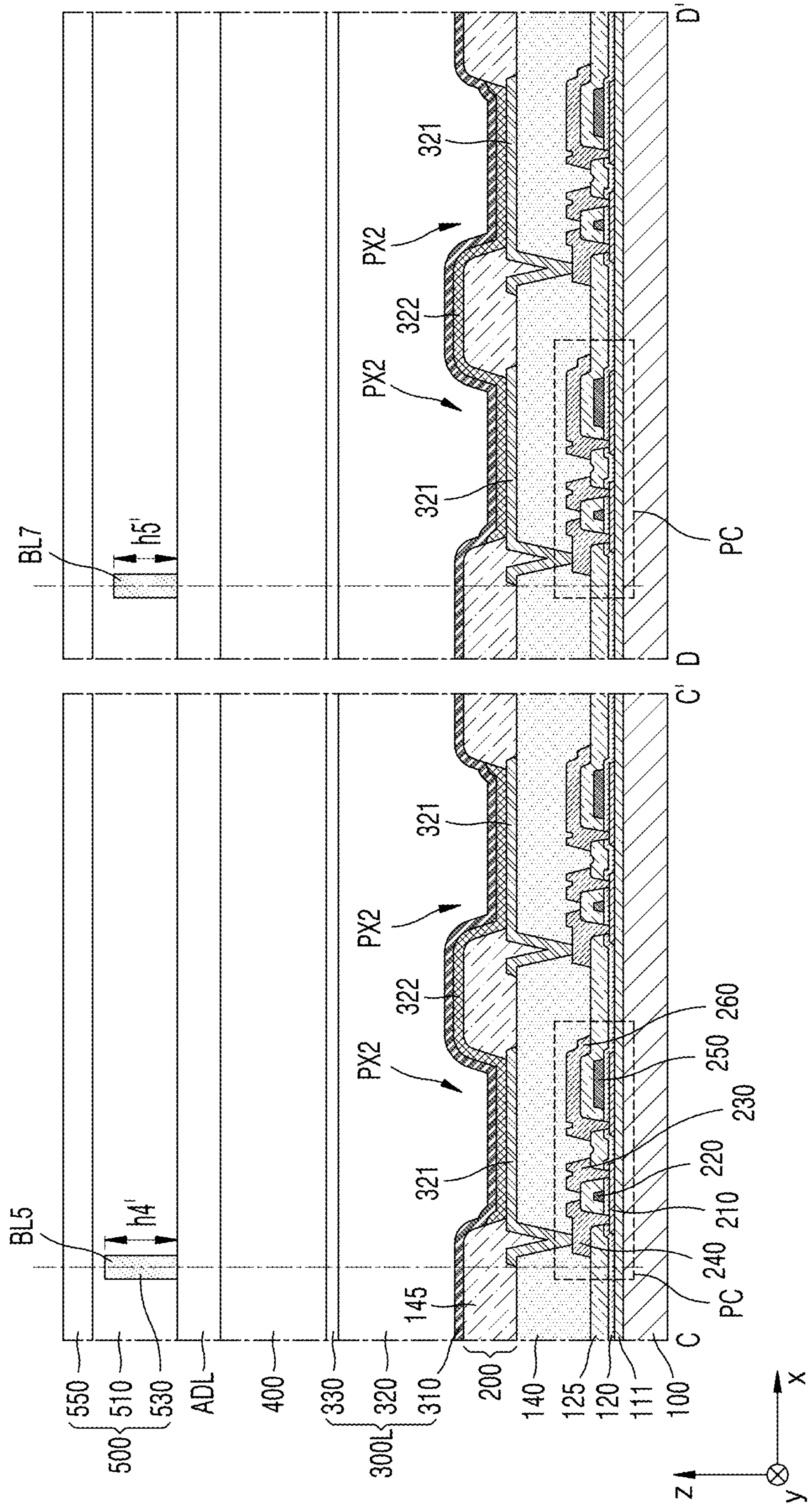
FIG. 12B is a cross-sectional view of the display apparatus taken along the line C-C' and the line D-D' of FIG. 7B, according to an embodiment.

FIG. 12A is a cross-sectional view of the display apparatus 1 taken along the line A-A' and the line B-B' of FIG. 7B, according to an embodiment, and FIG. 12B is a cross-sectional view of the display apparatus 1 taken along the line C-C' and the line D-D' of FIG. 7B, according to an embodiment. FIGS. 12A and 12B are modified examples of FIGS. 11A and 11B, and hereinafter, redundant descriptions will be omitted and differences will be mainly described.

Referring to FIGS. 12A and 12B, according to an embodiment, the shading lines BL respectively corresponding to the unit pixels PU arranged in different columns may be arranged in a certain pattern in which thicknesses repeatedly increase and decrease along the third direction (the +x direction).

For example, a thickness h3' of the third shading line BL3 corresponding to the second unit pixel PU2 may be less than a thickness h1' of the first shading line BL1 corresponding to the first unit pixel PU1. A thickness h4' of the fifth shading line BL5 corresponding to the third unit pixel PU3 may be the same as the thickness h1' of the first shading line BL1.

A thickness h5' of the seventh shading line BL7 corresponding to the fourth unit pixel PU4 may be less than the thickness h4' of the fifth shading line BL5 corresponding to the third unit pixel PU3. The thickness h5' of the seventh shading line BL7 corresponding to the fourth unit pixel PU4 may be the same as the thickness h3' of the third shading line BL3 corresponding to the second unit pixel PU2.

According to an embodiment, the thicknesses of the shading lines BL corresponding to unit pixels in different columns may be varied based on their positions within the display apparatus. As illustrated in FIGS. 12A and 12B, the shading lines BL may be designed to gradually increase in thickness toward the side of the display facing the driver's seat. This gradient in shading line thickness helps reduce variations in the amount of light visible from different locations on the display, particularly from the driver's viewing angle, as compared to an arrangement in which all of the shading lines BL have the same thickness regardless of location. Thus, a white graduation phenomenon of the display apparatus may be reduced.

Also, according to an embodiment, the shading lines BL corresponding to one unit pixel have a same thickness, thereby preventing color variation between unit pixels and ensuring consistent color reproduction across the display. Accordingly, display quality of the display apparatus may be enhanced. The shading lines BL may also be referred to as light-blocking lines. The lines may be referred to as shading lines since they may cast a shadow in a predetermined direction, such as toward the driver's seat, thereby preventing light emitted from adjacent sub-pixels from propagating toward undesired viewing angles.

The display apparatus according to the embodiment may be applied to various electronic devices. An electronic device according to an embodiment of the present disclosure may include the display apparatus described above, and may further include modules or apparatuses having additional functions in addition to the display apparatus.

Figure 13:
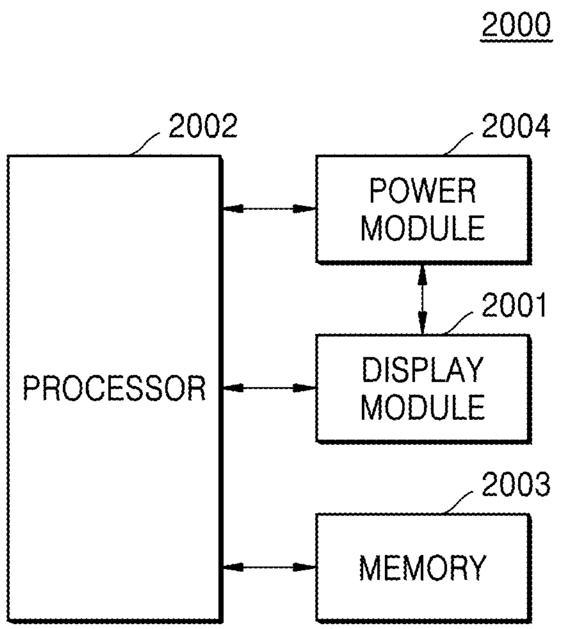
FIG. 13 is a block diagram of an electronic device according to an embodiment.

FIG. 13 is a block diagram of an electronic device according to an embodiment.

Referring to FIG. 13, an electronic device 2000 according to an embodiment may include a display module 2001, a processor 2002, a memory 2003, and a power module 2004.

The processor 2002 may include at least one of a central processing unit (CPU), an application processor (AP), a graphic processing unit (GPU), a communication processor (CP), an image signal processor (ISP), and a controller. In an embodiment, the processor 2002 may be divided into two or more from a functional or structural standpoint. For example, the processor 2002 may include a main processor in the form of a first drive chip including the central processing unit, and an auxiliary processor in the form of a second drive chip including the controller that receives an image signal from the main processor and processes the image signal to meet the interface specifications of the display module 2001.

The memory 2003 may store data information necessary for the operation of the processor 2002 or the display module 2001. When the processor 2002 executes an application stored in the memory 2003, an image data signal and/or an input control signal may be transmitted to the display module 2001, and the display module 2001 may process a signal received and output image information through a display screen.

The power module 2004 may include a power supply module such as a power adapter or a battery device, and a power conversion module that converts the power supplied by the power supply module to generate power necessary for the operation of the electronic device 2000.

At least one of the components of the electronic device 2000 described above may be included in the display apparatus according to the embodiments described above. In addition, a part among the individual modules functionally included in one module may be included in the display apparatus, and another part may be provided separately from the display apparatus. For example, the display apparatus may include the display module 2001, and the processor 2002, the memory 2003, and the power module 2004 may be provided in the form of other apparatuses within the electronic device 2000 except for the display apparatus.

In an embodiment, the display module 2001 included in the display apparatus may drive based on the image data signal and the input control signal received from the processor 2002.

Figure 14:
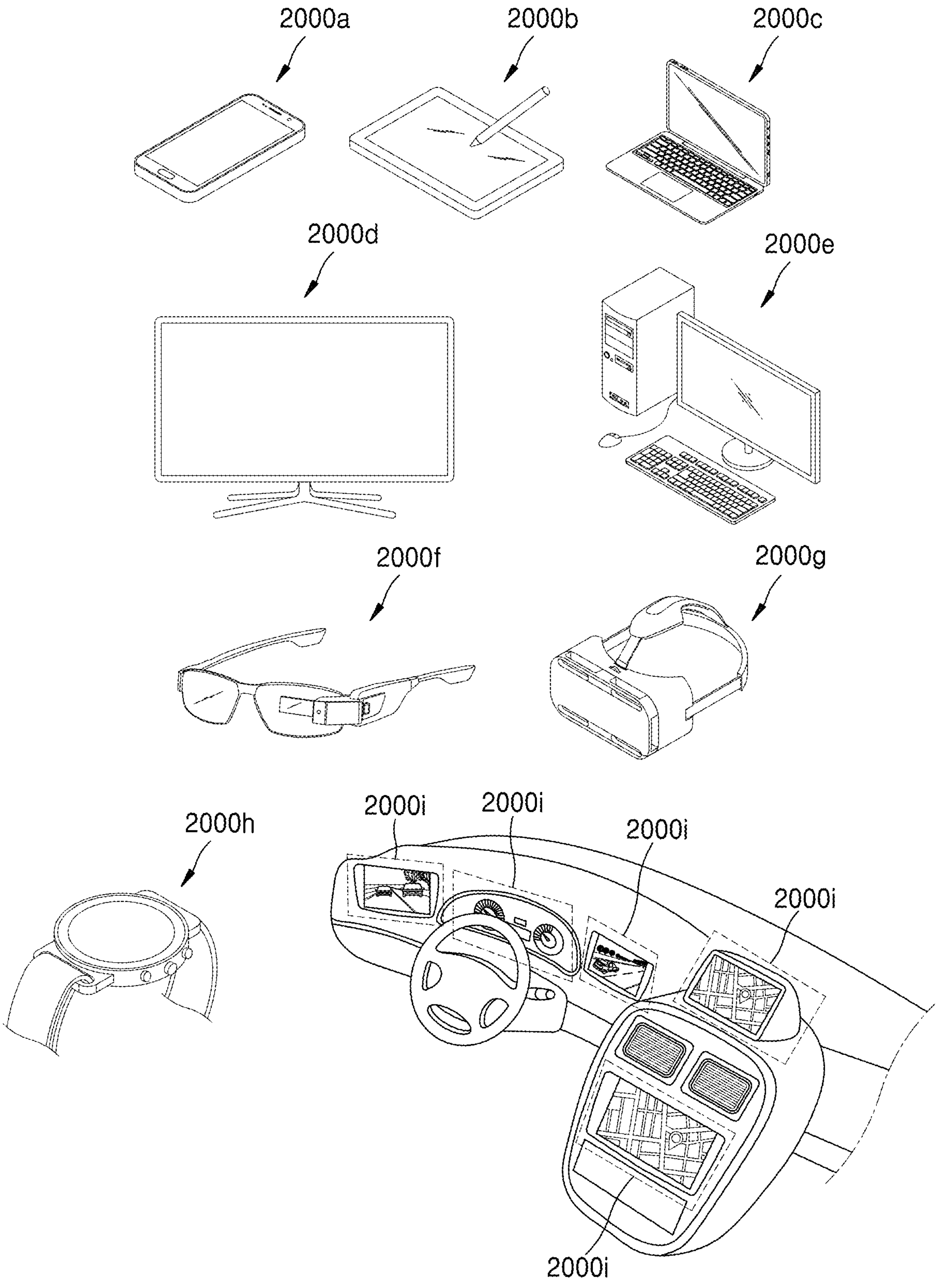
FIG. 14 is a schematic diagrams of electronic devices according to various embodiments.

FIG. 14 is schematic diagrams of electronic devices according to various embodiments.

Referring to FIG. 14, various electronic devices to which display apparatuses according to embodiments are applied may include not only image display electronic devices such as a smart phone 2000*a*, a tablet PC 2000*b*, a laptop 2000*c*, a TV 2000*d*, and a desk monitor 2000*e*, but also a wearable electronic device including display modules such as smart glasses 2000*f*, a head mounted display 2000*g*, and a smart watch 2000*h*, and a vehicle electronic device 2000*i* including a dashboard, a center fascia, and display modules such as a CID (Center Information Display) and a room mirror display disposed in the dashboard.

A display apparatus according to an embodiment, as described above, may block light from undesired viewing angles, such as light directed toward the driver's field of vision when the display apparatus is arranged in front of a passenger seat of a vehicle, by including a plurality of shading lines whose thicknesses vary based on their respective locations on the display.

In addition, in the display apparatus according to an embodiment, the plurality of shading lines corresponding to one unit pixel have a same thickness, thereby preventing color deviation between unit pixels based on their location within the display. However, the scope of the disclosure is not limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate including a display area and a peripheral area arranged outside the display area;

a plurality of sub-pixels arranged in rows and columns;

a display layer arranged in the display area and including a sub-pixel circuit and a light-emitting element, wherein the sub-pixel circuit and the light-emitting element are included in each of the plurality of sub-pixels;

an encapsulation member covering the display layer; and a light path control layer including a plurality of light-blocking lines, wherein the plurality of light-blocking lines are arranged in a first direction on one side of the sub-pixels in each odd column, and extend along a second direction intersecting the first direction in a plan view, the sub-pixels arranged in the odd column comprise a plurality of unit pixels each including a first sub-pixel of a first color, a second sub-pixel of a second color, and a third sub-pixel of a third color, and in a cross-sectional view intersecting the second direction, the light-blocking lines corresponding to one of the unit pixels have a same thickness.

2. The display apparatus of claim 1, wherein, in the cross-sectional view, the light-blocking lines corresponding to each of the unit pixels arranged in different columns have different thicknesses.

3. The display apparatus of claim 2, wherein the plurality of unit pixels comprise a first unit pixel, a second unit pixel, and a third unit pixel sequentially arranged along a direction opposite to the first direction, in the cross-sectional view, thicknesses of the light-blocking lines corresponding to the second unit pixel are less than thicknesses of the light-blocking lines corresponding to the first unit pixel, and thicknesses of the light-blocking lines corresponding to the third unit pixel are less than the thicknesses of the light-blocking lines corresponding to the second unit pixel.

4. The display apparatus of claim 2, wherein the plurality of unit pixels comprise a first unit pixel, a second unit pixel, a third unit pixel, and a fourth unit pixel sequentially arranged along a direction opposite to the first direction, in the cross-sectional view, thicknesses of the light-blocking lines corresponding to the second unit pixel are less than thicknesses of the light-blocking lines corresponding to the first unit pixel, thicknesses of the light-blocking lines corresponding to the fourth unit pixel are less than thicknesses of the light-blocking lines corresponding to the third unit pixel, the thicknesses of the light-blocking lines corresponding to the third unit pixel are the same as the thicknesses of the light-blocking lines corresponding to the first unit pixel, and the thicknesses of the light-blocking lines corresponding to the fourth unit pixel are the same as the thicknesses of the light-blocking lines corresponding to the second unit pixel.

5. The display apparatus of claim 1, wherein each of the plurality of unit pixels comprises:

the first sub-pixel and the second sub-pixel arranged in a first odd column; and the third sub-pixel arranged in a second odd column adjacent to the first odd column.

6. The display apparatus of claim 1, wherein each of the plurality of unit pixels comprises:

the first sub-pixel arranged in a first odd column;

the second sub-pixel arranged in a second odd column adjacent to the first odd column; and a third sub-pixel arranged in a third odd column adjacent to the second odd column.

7. The display apparatus of claim 5, wherein, in a plan view, two of the light-blocking lines are arranged corresponding to one of the unit pixels.

8. The display apparatus of claim 6, wherein, in a plan view, three of the light-blocking lines are arranged corresponding to one of the unit pixels.

9. The display apparatus of claim 1, further comprising:

a first driving circuit electrically connected to first gate lines configured to supply a first gate signal to the sub-pixels arranged in the odd column; and a second driving circuit electrically connected to second gate lines configured to supply a second gate signal to the sub-pixels arranged in an even column.

10. The display apparatus of claim 9, further comprising a controller, wherein, based on a control signal from the controller, the first driving circuit is configured to supply a turn-on signal to the first gate lines and the second driving circuit is configured to supply a turn-off signal to the second gate lines.

11. A vehicle comprising:

a display apparatus disposed within a cabin of the vehicle, wherein the display apparatus comprises:

a substrate including a display area and a peripheral area arranged outside the display area;

a plurality of sub-pixels arranged in rows and columns;

a display layer arranged in the display area and including a sub-pixel circuit and a light-emitting element, wherein the sub-pixel circuit and the light-emitting element are included in each of the plurality of sub-pixels;

an encapsulation member covering the display layer; and a light path control layer including the plurality of light-blocking lines, wherein the plurality of light-blocking lines are arranged in a first direction on one side of the sub-pixels arranged in each odd column and extend along a second direction intersecting the first direction in a plan view, the sub-pixels arranged in the odd column comprise a plurality of unit pixels each including a first sub-pixel of a first color, a second sub-pixel of a second color, and a third sub-pixel of a third color, and in a cross-sectional view intersecting the second direction, the light-blocking lines corresponding to one of the unit pixels have a same thickness.

12. The vehicle of claim 11, wherein in the cross-sectional, the light-blocking lines corresponding to each of the unit pixels arranged in different columns have different thicknesses.

13. The vehicle of claim 12, wherein the plurality of unit pixels comprise a first unit pixel, a second unit pixel, and a third unit pixel sequentially arranged along a direction opposite to the first direction, in the cross-sectional view, thicknesses of the light-blocking lines corresponding to the second unit pixel are less than thicknesses of the light-blocking lines corresponding to the first unit pixel, and thicknesses of the light-blocking lines corresponding to the third unit pixel are less than the thicknesses of the light-blocking lines corresponding to the second unit pixel.

14. The vehicle of claim 12, wherein the plurality of unit pixels comprise a first unit pixel, a second unit pixel, a third unit pixel, and a fourth unit pixel sequentially arranged along a direction opposite to the first direction, in the cross-sectional view, thicknesses of the light-blocking lines corresponding to the second unit pixel are less than thicknesses of the light-blocking lines corresponding to the first unit pixel, thicknesses of the light-blocking lines corresponding to the fourth unit pixel are less than thicknesses of the light-blocking lines corresponding to the third unit pixel, the thicknesses of the light-blocking lines corresponding to the third unit pixel are same as the thicknesses of the light-blocking lines corresponding to the first unit pixel, and the thicknesses of the light-blocking lines corresponding to the fourth unit pixel are same as the thicknesses of the light-blocking lines corresponding to the second unit pixel.

15. The vehicle of claim 11, wherein each of the plurality of unit pixels comprises:

the first sub-pixel and the second sub-pixel arranged in a first odd column; and the third sub-pixel arranged in a second odd column adjacent to the first odd column.

16. The vehicle of claim 11, wherein each of the plurality of unit pixels comprises:

the first sub-pixel arranged in a first odd column;

the second sub-pixel arranged in a second odd column adjacent to the first odd column; and a third sub-pixel arranged in a third odd column adjacent to the second odd column.

17. The vehicle of claim 15, wherein, in a plan view, two of the light-blocking lines are arranged corresponding to one of the unit pixels.

18. The vehicle of claim 16, wherein, in a plan view, three of the light-blocking lines are arranged according to one of the unit pixels.

19. An electronic device comprising a display apparatus, wherein the display apparatus comprises:

a substrate including a display area and a peripheral area arranged outside the display area;

a plurality of sub-pixels arranged in rows and columns, the sub-pixels comprising a plurality of unit pixels, each unit pixel including a first sub-pixel of a first color, a second sub-pixel of a second color, and a third sub-pixel of a third color;

a display layer arranged in the display area and including a sub-pixel circuit and a light-emitting element, wherein the sub-pixel circuit and the light-emitting element are included in each of the plurality of sub-pixels:

an encapsulation member covering the display layer;

a light path control layer including the plurality of light-blocking lines, wherein the plurality of light-blocking lines are disposed on one side of the sub-pixels in selected columns, and the light-blocking lines extend in a direction intersecting an arrangement direction of the sub-pixels in a plan view; and a controller configured to operate the display apparatus in one of:

a first mode in which sub-pixels in selected columns among the sub-pixels, which are adjacent to the light-blocking lines, are activated to emit light, and sub-pixels in other columns among the sub-pixels, which are not adjacent to the light-blocking lines, are deactivated; and a second mode in which the sub-pixels in other columns are activated to emit light and the sub-pixels in selected columns are deactivated.

* * * * *